(12) United States Patent
Tsai et al.

(10) Patent No.: US 12,720,801 B2
(45) Date of Patent: Aug. 25, 2026

(54) TRANSISTOR STRUCTURE WITH LOW RESISTANCE CONTACT

(71) Applicant: Taiwan Semiconductor Manufacturing Company, Ltd., Hsinchu (TW)

(72) Inventors: Ming-Heng Tsai, Taipei (TW); Chih-Hao Chang, Hsinchu (TW); Chun-Sheng Liang, Hsin-Chu (TW); Ta-Chun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 586 days.

(21) Appl. No.: 18/152,681

(22) Filed: Jan. 10, 2023

(65) Prior Publication Data

US 2024/0145555 A1 May 2, 2024

Related U.S. Application Data

(60) Provisional application No. 63/420,378, filed on Oct. 28, 2022.

(51) Int. Cl.
*H10D 30/43* (2025.01)
*H10D 30/01* (2025.01)
(Continued)

(52) U.S. Cl.
CPC ....... *H10D 30/6729* (2025.01); *H10D 30/014* (2025.01); *H10D 30/43* (2025.01);
(Continued)

(58) Field of Classification Search
CPC ............ H10D 84/0193; H10D 84/853; H10D 30/6728; H10D 30/6733; H10D 30/6735;
(Continued)

(56) References Cited

U.S. PATENT DOCUMENTS 11,462,612 B2 10/2022 Cheng
2016/0071846 A1* 3/2016 Wen .................... H10D 84/038 438/283

(Continued)

FOREIGN PATENT DOCUMENTS

TW 202209499 A 3/2022
TW 202238742 A 10/2022

*Primary Examiner* — Moin M Rahman
(74) *Attorney, Agent, or Firm* — HAYNES AND BOONE, LLP

(57) ABSTRACT

Semiconductor structures and processes are provided. A semiconductor structure of the present disclosure includes a first base portion and a second base portion extending lengthwise along a first direction, a first source/drain feature disposed over the first base portion, a second source/drain feature disposed over the second base portion, a center dielectric fin sandwiched between the first source/drain feature and the second source/drain feature along a second direction perpendicular to the first direction, and a source/drain contact disposed over the first source/drain feature, the second source/drain feature and the center dielectric fin. A portion of the source/drain contact extends between the first source/drain feature and the second source/drain feature along the second direction.

20 Claims, 20 Drawing Sheets

(51) Int. Cl.

| | |
|---|---|
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |

(52) U.S. Cl.
CPC ..... *H10D 30/6735* (2025.01); *H10D 30/6757* (2025.01); *H10D 62/121* (2025.01); *H10D 64/017* (2025.01); *H10D 64/021* (2025.01); *H10D 84/0167* (2025.01); *H10D 84/017* (2025.01); *H10D 84/038* (2025.01)

(58) Field of Classification Search
CPC .. H10D 62/118; H10D 89/931; H10D 64/252; H10D 84/0188; H10D 84/201; H10D 18/60; H10D 30/62–6219; H10D 30/024–0245; H10D 84/0158; H10D 86/011; H10D 84/834; H10D 86/215; H10D 30/673; H10D 30/689; H10D 30/0323; H10D 30/6713; H10D 30/6744; H10D 30/6757; H10D 62/021; H10D 64/015; H10D 64/021; H10D 62/151; H10D 62/364; H10D 64/017; H10D 30/797; H10D 64/671; H10D 30/60–798; H10D 30/021–0415; H10D 84/83–859; H10D 84/0128; H10D 84/0167; H10D 62/85–854; H10D 30/751; H10D 30/027–0278; H10D 30/63; H10D 84/016; H10D 30/501–509; H10D 84/0177; H10D 84/038; H10D 30/6215; H10D 30/0217; H10D 84/0165–0195; H10D 84/85–859; H10D 84/907–994; H10D 30/031; H10D 48/362; H10D 30/472; H10D 30/014; H10D 30/43; H10D 30/01; H10D 62/80; H10D 62/8303; H10D 62/882; H10D 99/00; H10D 62/121; H10D 62/235; H10D 89/10; H10D 62/292; H01L 21/76224; H01L 21/31116; H01L 21/30604; H01L 21/3065; H01L 21/02068; H01L 21/32134; H01L 21/32136; H01L 21/32137; H01L 21/3213; H01L 21/0228; H02K 15/027; A23B 2/783; A45C 11/003; A61K 40/4218; H10F 77/955; H10H 20/826; B82Y 10/00; H10B 12/36; H10B 12/056; H10B 63/34; B81C 2203/0728; B81C 2203/0735; B81C 2203/0742
See application file for complete search history.

(56) References Cited

U.S. PATENT DOCUMENTS

| | | | | |
|---|---|---|---|---|
| 2019/0067444 | A1* | 2/2019 | Ching | H10D 84/017 |
| 2021/0091230 | A1* | 3/2021 | Wu | H10D 62/151 |
| 2021/0217890 | A1* | 7/2021 | Yang | H10D 62/151 |
| 2021/0376071 | A1 | 12/2021 | Liu | |
| 2022/0216203 | A1 | 7/2022 | Cheng | |
| 2022/0328477 | A1 | 10/2022 | Chen | |
| 2022/0328647 | A1 | 10/2022 | Liu | |

* cited by examiner

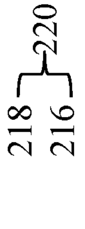
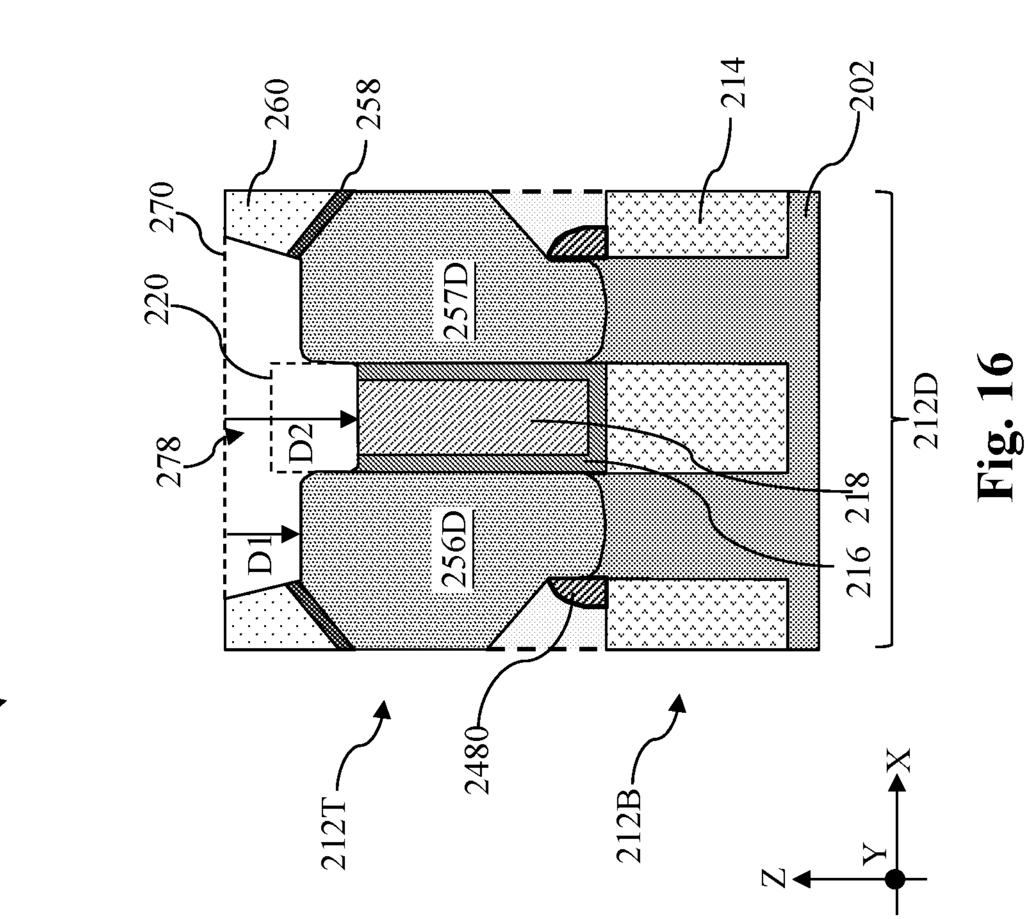
Fig. 16
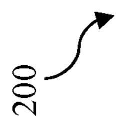

TRANSISTOR STRUCTURE WITH LOW RESISTANCE CONTACT

PRIORITY DATA

This application claims priority to U.S. Provisional Patent Application No. 63/420,378 filed Oct. 28, 2022, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. Multi-gate devices may include variants of the FinFETs and MBC transistors.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-20 illustrate fragmentary perspective views or cross-sectional views of a workpiece during various fabrication stages in the method of FIG. 1, according to one or more aspects of the present disclosure.

DETAILED DESCRIPTION

Figure 1:
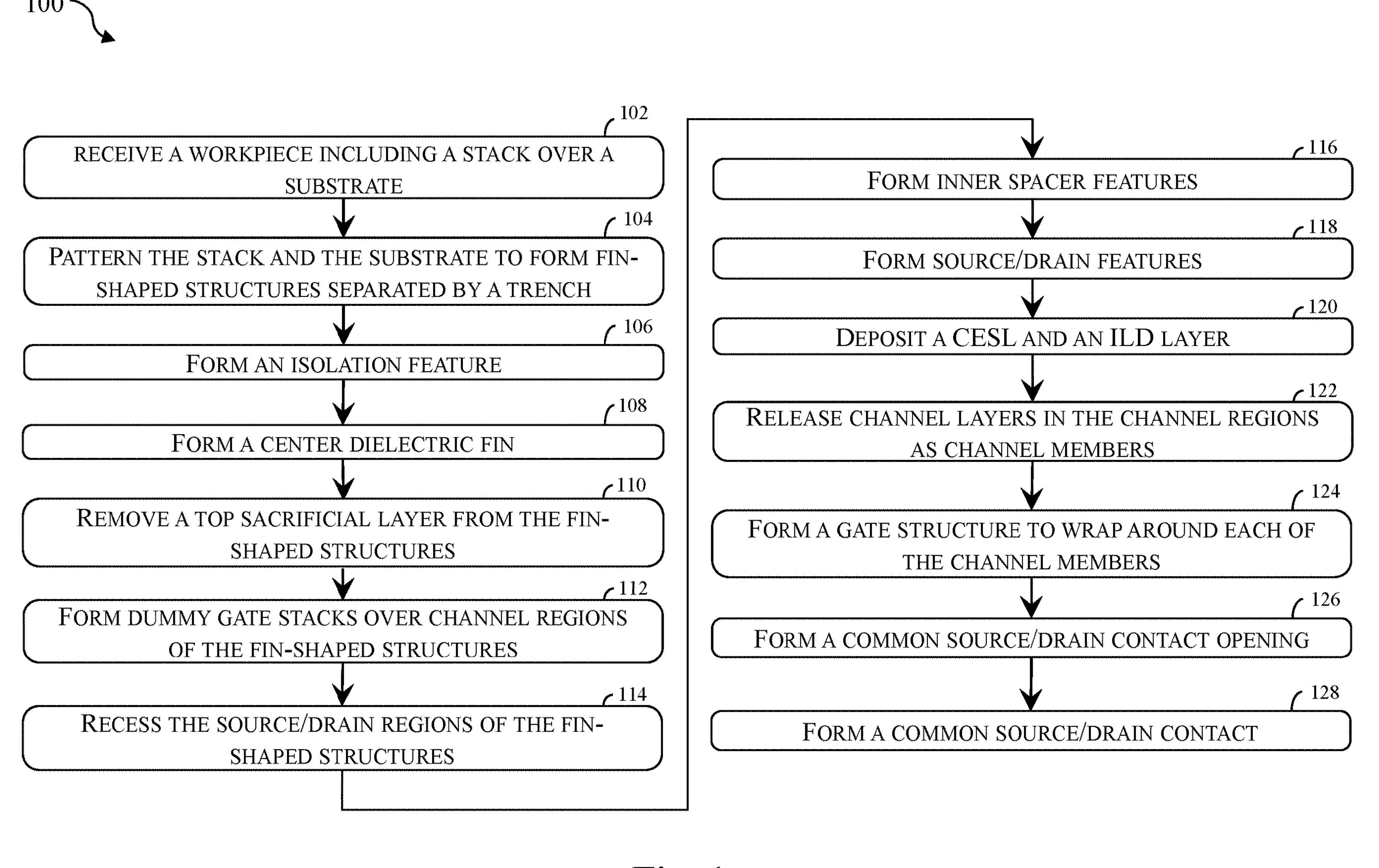
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

To improve drive current to meet design needs, MBC transistors may include nanoscale channel members or nanostructures that are thin and wide. Such MBC transistors may also be referred to as nanosheet transistors. While nanosheet transistors are able to provide satisfactory drive current and channel control, their wider nanosheet channel members may make it challenging to reduce cell sizes. Variants of MBC transistors, such as fish-bone structures or forksheet structures, have been proposed to reduce cell dimensions. In a fish-bone structure or a forksheet structure, adjacent stacks of channel members may be divided by a dielectric wall (or a dielectric fin). The dielectric wall usually has a height substantially equal to or greater than that of the topmost channel members or that of the source/drain features. The dielectric wall and dielectric features over the dielectric wall may be used to isolate adjacent source/drain contacts.

The present disclosure provides a semiconductor structure where a source/drain contact that spans over a dielectric wall of a forksheet transistor extends downward between two source/drain features when the source/drain features are to be electrically connected. In some embodiments where two source/drain features are to be connected by design, the dielectric wall that separates the two source/drain features are recessed to have a top surface lower than the two source/drain features. The source/drain contact is then formed over the two source/drain features. This recessed dielectric wall between two source/drain features allows the source/drain contact to wrap over sidewalls of the two source/drain features, thereby increasing contact areas and reducing contact resistance.

The various aspects of the present disclosure will now be described in more detail with reference to the figures. FIG. 1 illustrates a flowchart of a method 100 of forming a semiconductor device. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-19, which illustrate fragmentary cross-sectional views of a workpiece 200 at different stages of fabrication according to embodiments of method 100. Because a semiconductor device or a semiconductor structure will be formed from the workpiece 200, the workpiece 200 may be referred to as a semiconductor device 200 or a semiconductor structure 200 as the context requires. The X direction, the Y direction, and the Z direction in FIGS. 2-19 are perpendicular to one another and are used consistently. Additionally, throughout the present disclosure, like reference numerals are used to denote like features.

Figure 2:
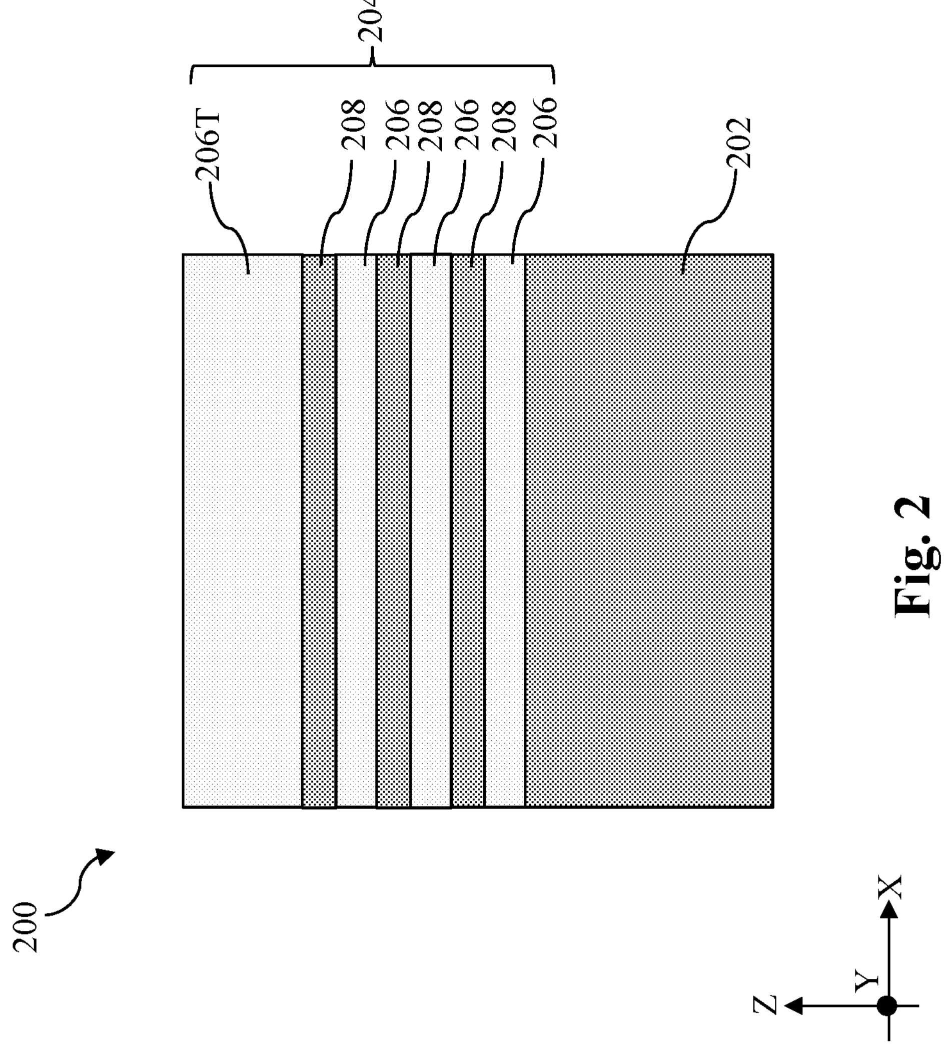

Referring to FIGS. 1 and 2, method 100 includes a block 102 where a workpiece 200 is received. As shown in FIG. 2, the workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may include multiple n-type well regions and multiple p-type well regions. A p-type well region may be doped with a p-type dopant (i.e., boron (B)). An n-type well region may be doped with an n-type dopant (i.e., phosphorus (P) or arsenic (As)).

In some embodiments represented in FIG. 2, the stack 204 may include a plurality of channel layers 208 interleaved by a plurality of sacrificial layers 206. In the depicted embodiment, the plurality of sacrificial layers 206 include a sacrificial layer 206 disposed on the substrate 202 and a topmost sacrificial layer 206T. The layers in the stack 204 may be deposited over the substrate 202 using an epitaxial process. Example epitaxial process may include vapor-phase epitaxy (VPE), ultra-high vacuum CVD (UHV-CVD)), molecular beam epitaxy (MBE), and/or other suitable processes. The channel layers 208 and the sacrificial layers 206 (including the topmost sacrificial layer 206T) may have different semiconductor compositions. In some implementations, the channel layers 208 are formed of silicon (Si) and sacrificial layers 206 are formed of silicon germanium (SiGe). The additional germanium (Ge) content in the sacrificial layers 206 allow selective removal or recess of the sacrificial layers 206 without substantial damages to the channel layers 208. The sacrificial layers 206 and the channel layers 208 are disposed alternatingly such that sacrificial layers 206 interleave the channel layers 208. FIG. 2 illustrates that four (4) layers of the sacrificial layers 206 (including the topmost sacrificial layer 206T) and three (3) layers of the channel layers 208 are alternately and vertically arranged, which is for illustrative purposes only and not intended to be limiting beyond what is specifically recited in the claims. The number of layers depends on the desired number of channels members 208 for the semiconductor device 200. In some embodiments, the number of the channel layers 208 is between 1 and 6. Like the sacrificial layers 206, the top sacrificial layer 206T may be formed of silicon germanium (SiGe). In some instances, compositions of the sacrificial layers 206 and the top sacrificial layer 206T are substantially the same. The top sacrificial layer 206T may be thicker than the other sacrificial layers 206 and functions to protect the stack 204 from damages during fabrication processes. In some instances, a thickness of the top sacrificial layer 206T may be between about 20 nm and about 40 nm while a thickness of a sacrificial layer 206 may be between about 4 nm and about 15 nm.

Figure 3:
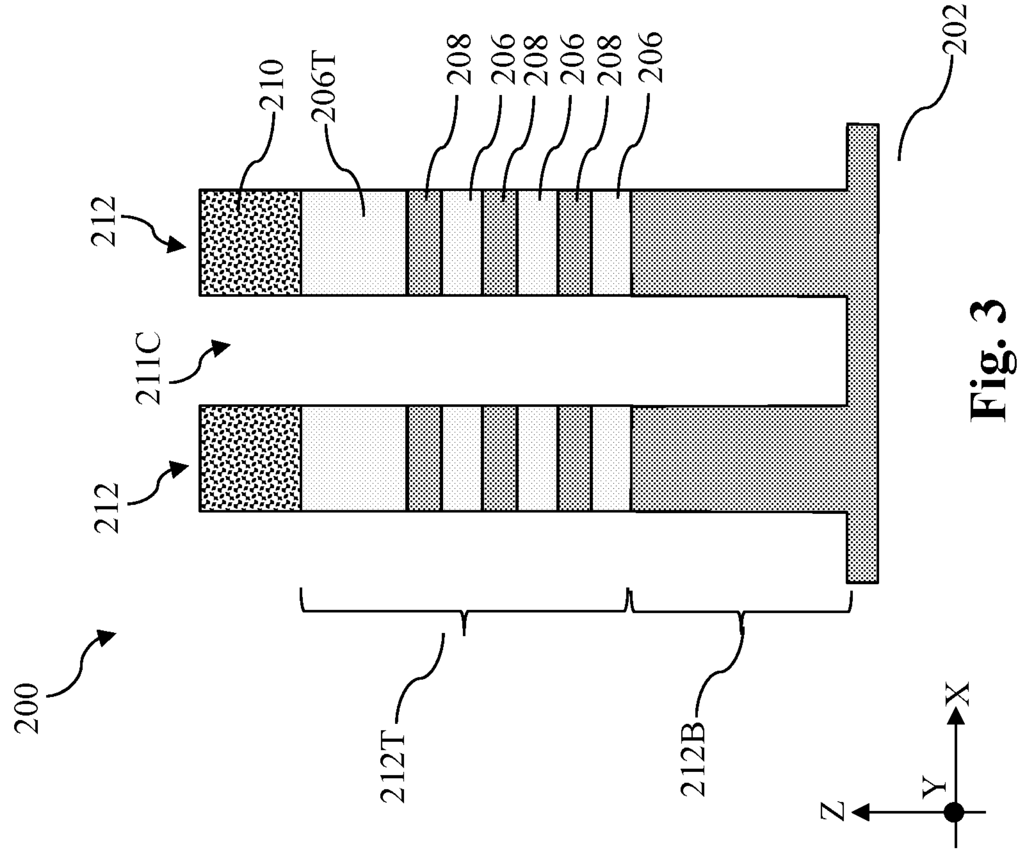

Referring to FIGS. 1 and 3, method 100 includes a block 104 where the stack 204 and the substrate 202 are patterned to form fin-shaped structures 212 separated by a center trench 211C and separation trenches 211. To pattern the stack 204 and the substrate 202, a fin-top hard mask layer 210 is deposited over the top sacrificial layer 206T. The fin-top hard mask layer 210 is then patterned to serve as an etch mask to pattern the stack 204 and a portion of the substrate 202. In some embodiments, the fin-top hard mask layer 210 may be deposited using CVD, plasma-enhanced CVD (PECVD), atomic layer deposition (ALD), plasma-enhanced ALD (PEALD), or a suitable deposition method. The fin-top hard mask layer 210 may be a single layer or a multilayer. When the fin-top hard mask layer 210 is a multi-layer, the fin-top hard mask layer 210 may include a pad oxide and a pad nitride layer. In an alternative embodiment, the fin-top hard mask layer 210 is a single layer and is formed of silicon (Si). The fin-shaped structures 212 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-top hard mask layer 210 and then the patterned fin-top hard mask layer 210 may be used as an etch mask to etch the stack 204 and the substrate 202 to form fin-shaped structures 212. The etching process can include dry etching, wet etching, reactive ion etching (RIE), and/or other suitable processes.

As shown in FIG. 3, each of the fin-shaped structures 212 includes a base portion 212B formed from a portion of the substrate 202 and a top portion 212T formed from the stack 204. The base portion 212B may also be referred to as a mesa 212B. The top portion 212T is disposed over the base portion 212B. The fin-shaped structures 212 extend lengthwise along the Y direction and extend vertically along the Z direction from the substrate 202. Along the X direction, the two fin-shaped structures 212 in FIG. 3 are separated from one another by the center trench 211C while they are separated from other adjacent fin-shaped structures by separation trenches 211. A width of the separation trenches 211 may be greater than a width of the center trench 211C along the X direction. In some embodiments, a width of the center trench 211C is between about 5 nm and about 50 nm. In some implementations, the separation trenches 211 are disposed over a junction of an n-type well region and a p-type well region and may therefore be referred to as junction trenches 211.

Figure 4:
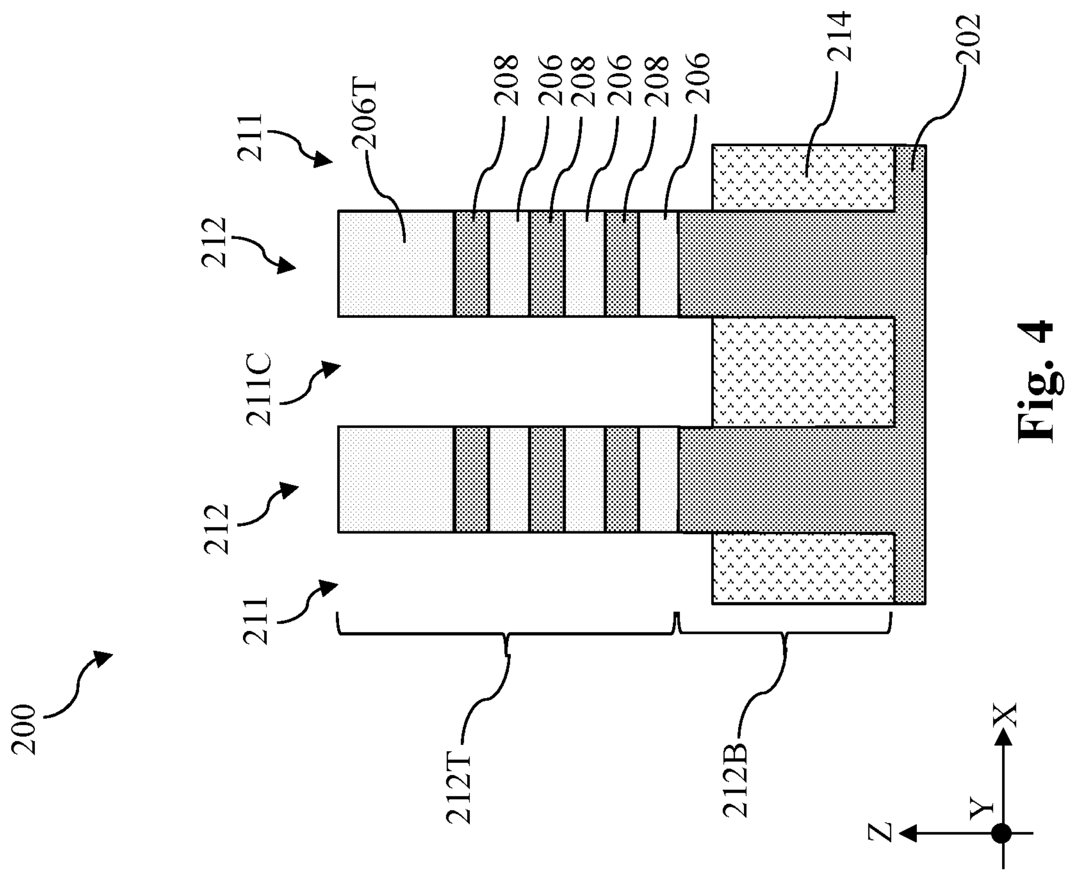

Referring to FIGS. 1 and 4, method 100 includes a block 106 where an isolation feature 214 is formed in the center trench 211C and the separation trenches 211. The isolation feature 214 may be referred to as a shallow trench isolation (STI) feature 214. In an example process to form these isolation feature 214, a dielectric material is deposited over the workpiece 200, filling the center trench 211C and the separation trenches 211 with the dielectric material. In some embodiments, the dielectric material may tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In various examples, at block 106, the dielectric material may be deposited by flowable CVD (FCVD), spin-on coating, and/or other suitable process. The deposited dielectric material is then thinned and planarized, for example by a chemical mechanical polishing (CMP) process, until the top sacrificial layer 206T is exposed. After the planarization, the deposited dielectric material is etched back until the top portions 212T of the fin-shaped structures 212 rises above the isolation feature 214. In some embodiments, a portion of the base portion 212B may also rise above the isolation feature 214. At this point, the base portions 212B, or a substantial portion thereof, is surrounded by the isolation features 214. The isolation feature 214 reduces the depths of the center trench 211C and the separation trenches 211.

Figure 5:
Figure 5:
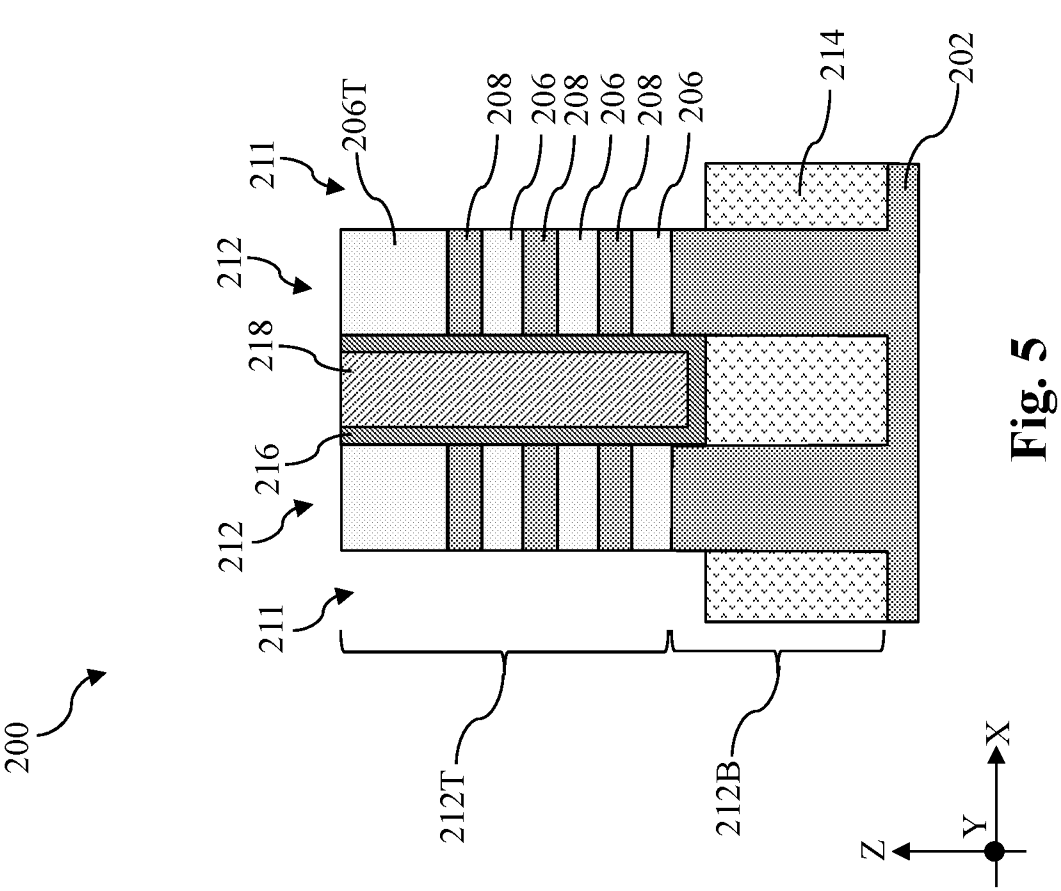

Referring to FIGS. 1 and 5, method 100 includes a block 108 where a center dielectric fin 220 is formed. To form the center dielectric fin 220, a first layer 216 and a second layer 218 are conformally deposited over the workpiece 200, including in the center trench 211C and the separation trenches 211. The first layer 216 may be conformally deposited using CVD, ALD, or a suitable method. The first layer 216 lines the sidewalls and the bottom surfaces of the center trench 211C and the separation trenches 211. The second layer 218 is then conformally deposited over the first layer 216 using CVD, high density plasma CVD (HDPCVD), and/or other suitable process. In some embodiments, the first layer 216 and the second layer 218 both include nitride-based dielectric material to ensure that the center dielectric fin 220 can withstand various etching operations. In some instances, the first layer 216 and the second layer 218 may include silicon nitride, silicon carbonitride, silicon oxycarbonitride, aluminum nitride, aluminum oxynitride, zirconium nitride, silicon oxynitride, or a suitable dielectric material. A composition of the first layer 216 may be different from a composition of the second layer 218. In one embodiment, the first layer 216 includes silicon oxycarbonitride and the second layer 218 includes silicon carbonitride. In some alternative embodiments not explicitly illustrated in FIG. 5, the center dielectric fin 220 is a single layer formed of a nitride-based dielectric material such as silicon nitride, silicon carbonitride, silicon oxycarbonitride, aluminum nitride, aluminum oxynitride, zirconium nitride, silicon oxynitride, or a suitable dielectric material.

After the conformal deposition of the first layer 216 and the second layer 218, the deposited first layer 216 and the second layer 218 are etched back to expose the top sacrificial layer 206T. Due to the loading effect, the deposited first layer 216 and the second layer 218 in the wider and more accessible separation trenches 211 are remove by the etch back process while the deposited first layer 216 and the second layer 218 in the narrower and denser center trench 211C remains to become the center dielectric fin 220. In some embodiments, the first layer 216 and the second layer 218 may be etched back in a dry etch process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the etch back may include a first stage that is directed toward the second layer 218 and a second stage that is directed toward the first layer 216. As shown in FIG. 5, upon conclusion of the etch back, the isolation feature 214 is exposed in the separation trenches 211.

Figure 6:
Figure 6:
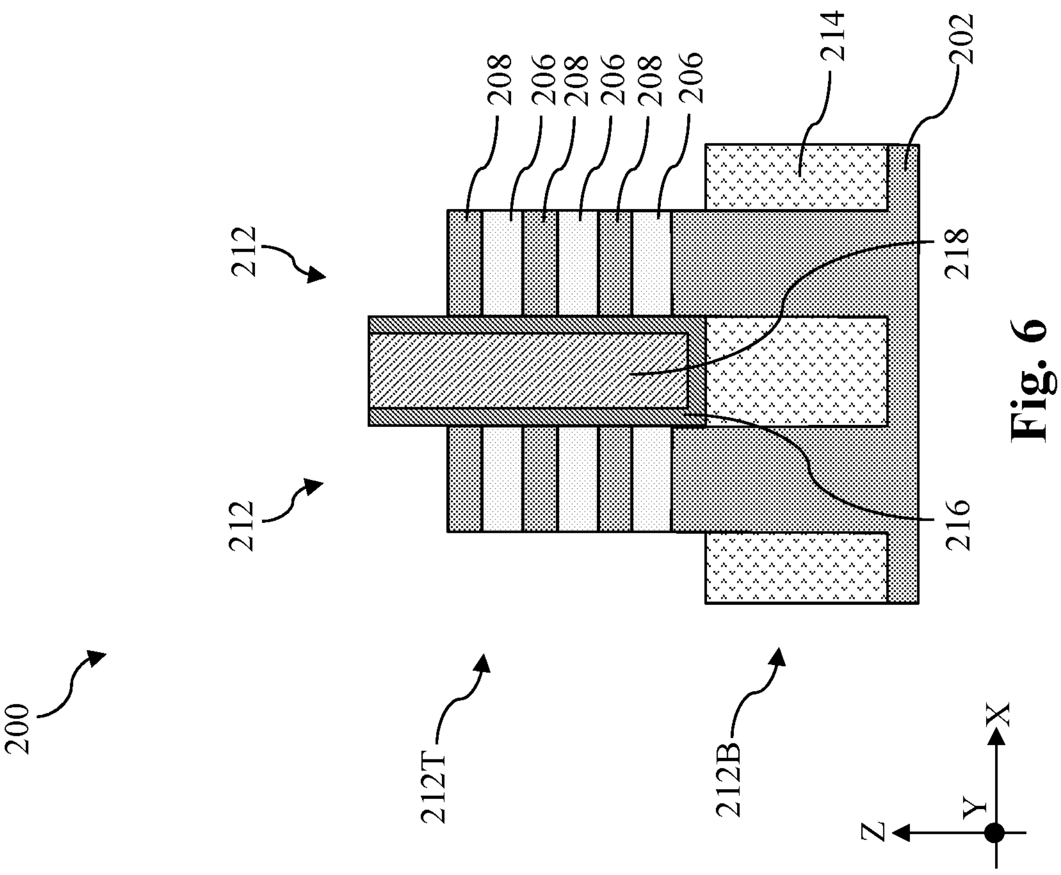

Referring to FIGS. 1 and 6, method 100 includes a block 110 where the top sacrificial layer 206T is removed from the fin-shaped structures 212. At block 110, the workpiece 200 is etched to selectively remove the top sacrificial layer 206T to expose the topmost channel layer 208, without substantially damaging the center dielectric fin 220. Because the top sacrificial layer 206T is formed of silicon germanium (SiGe), the etch process at block 110 may be selective to silicon germanium (SiGe). In some instances, the top sacrificial layer 206T may be etched using a selective wet etch process that includes ammonium hydroxide ($NH_4OH$), hydrogen fluoride (HF), hydrogen peroxide ($H_2O_2$), or a combination thereof. As shown in FIG. 6, after the removal of the top sacrificial layer 206T, the center dielectric fin 220 rises above the topmost channel layer 208.

Figure 7:
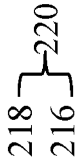
Figure 7:
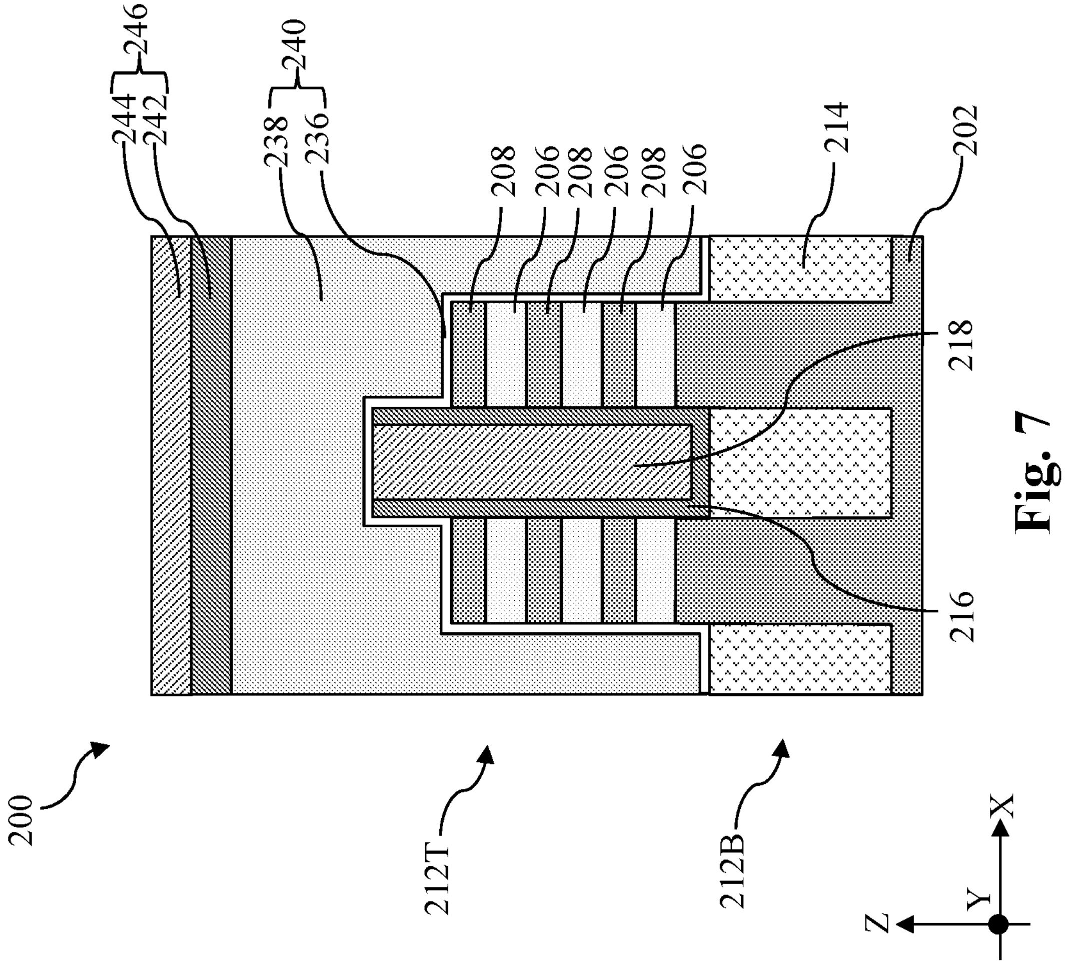
Figure 8:
Figure 8:
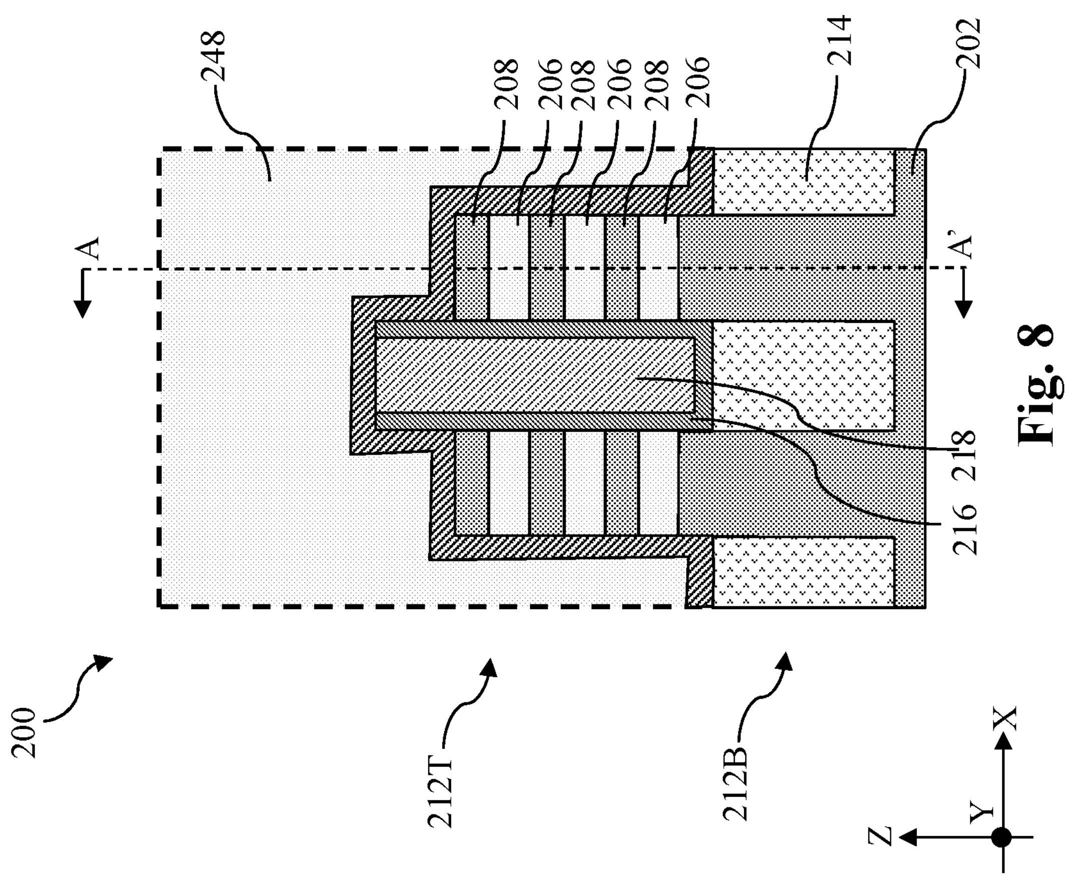

Referring to FIGS. 1, 7 and 8, method 100 includes a block 112 where a dummy gate stack 240 is formed over the channel regions of the fin-shaped structures 212. In some embodiments, a gate replacement process (or gate-last process) is adopted where the dummy gate stack 240 serves as a placeholder for a functional gate structure. Other processes and configuration are possible. As shown in FIG. 7, the dummy gate stack 240 includes a dummy dielectric layer 236 and a dummy electrode 238 disposed over the dummy dielectric layer 236. For patterning purposes, a gate top hard mask 246 is deposited over the dummy gate stack 240. The gate top hard mask 246 may be a multi-layer and include a silicon nitride mask layer 242 and a silicon oxide mask layer 244 over the silicon nitride mask layer 242. The regions of the fin-shaped structures 212 underlying the dummy gate stack 240 may be referred to as channel regions. Each of the channel regions in a fin-shaped structure 212 is sandwiched between two source/drain regions for source/drain formation. In an example process, the dummy dielectric layer 236 is blanketly deposited over the workpiece 200 by CVD. A semiconductor layer for the dummy electrode 238 is then blanketly deposited over the dummy dielectric layer 236. The dummy dielectric layer 236 and the semiconductor layer for the dummy electrode 238 are then patterned using photolithography processes to form the dummy gate stack 240. In some embodiments, the dummy dielectric layer 236 may include silicon oxide and the dummy electrode 238 may include polycrystalline silicon (polysilicon).

Reference is made to FIG. 8. At block 112, at least one gate spacer 248 is formed along sidewalls of the dummy gate stacks 240. Dielectric materials for the at least one gate spacer 248 may be selected to allow selective removal of the dummy gate stack 240. Suitable dielectric materials may include silicon nitride, silicon oxycarbonitride, silicon carbonitride, silicon oxycarbide, silicon carbide, silicon oxynitride, and/or combinations thereof. In an example process, the at least one gate spacer 248 may be conformally deposited over the workpiece 200 using CVD, subatmospheric CVD (SACVD), or ALD. As shown in FIG. 8, the at least one gate spacer 248 not only is deposited along sidewalls of the dummy gate stack 240 (shown in dotted lines as it is out of the plane), but also deposited on top surfaces and sidewalls of the isolation feature 214, the fin-shaped structures 212, and the center dielectric fin 220. Each of the fin-shaped structures 212 has a sidewall in contact with the center dielectric fin 220.

Figure 9:
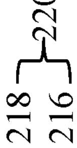
Figure 9:
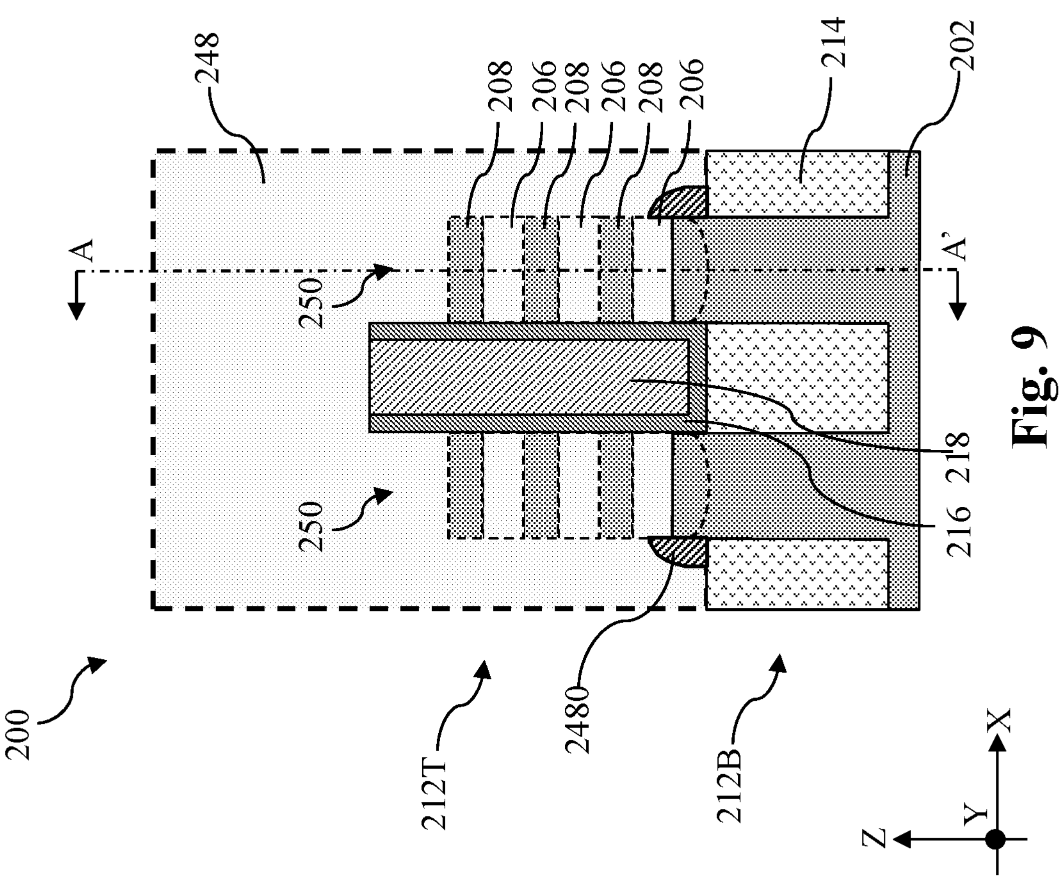
Figure 10:
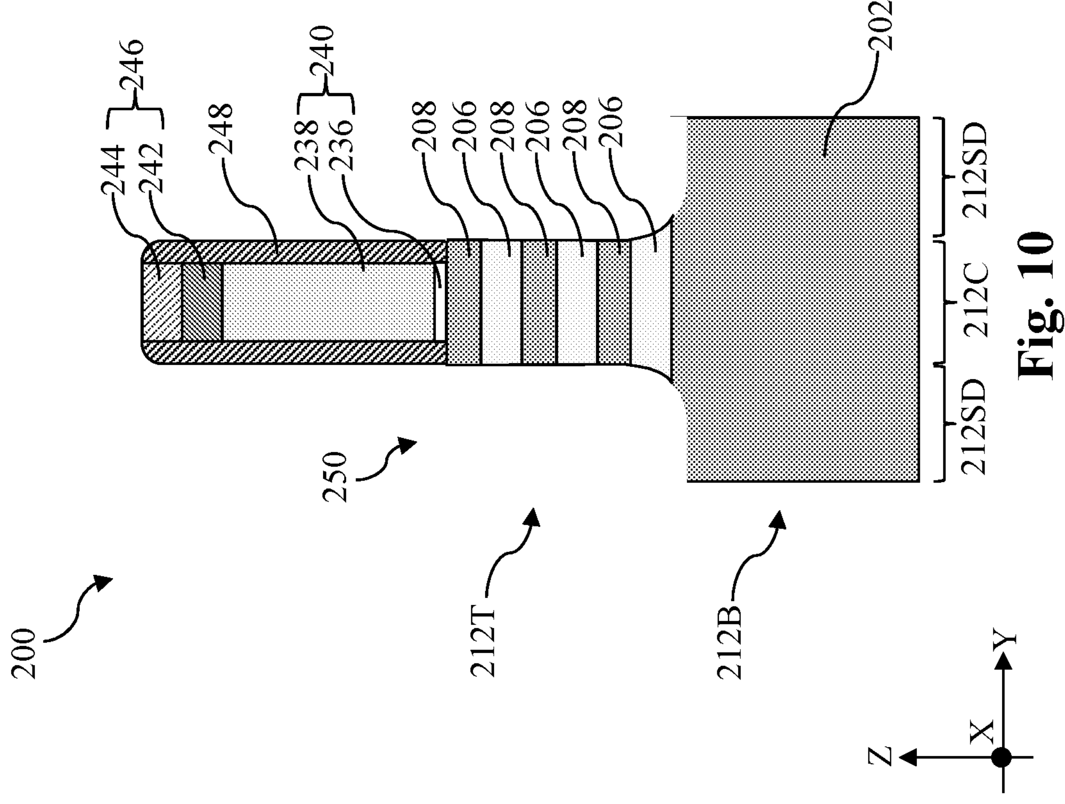

Referring to FIGS. 1, 9 and 10, method 100 includes a block 114 where the source/drain regions of the fin-shaped structures 212 are recessed to form source/drain recesses 250. With the dummy gate stack 240 and the at least one gate spacer 248 serving as an etch mask, the workpiece 200 is anisotropically etched to form the source/drain recesses 250 (or source/drain trenches 250) over the source/drain regions of the fin-shaped structures 212. In some embodiments as illustrated in FIG. 9, operations at block 120 may completely remove the sacrificial layers 206 and channel layers 208 in the source/drain regions. FIG. 9 illustrates the sacrificial layers 206 and channel layers 208 under the dummy gate stack 240 in dotted lines as they are out of the illustration plane. The anisotropic etch at block 120 may include a dry etch process. For example, the dry etch process may implement hydrogen ($H_2$), a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Sidewalls of the channel layers 208 and the sacrificial layers 206 under the dummy gate stack 240 are exposed in the source/drain recesses 250. At block 114, the at least one gate spacer 248 deposited over top surfaces and sidewalls of the isolation feature 214, the fin-shaped structures 212, and the center dielectric fin 220 is also etched back. In some embodiments represented in FIG. 9, a portion of the at least one gate spacer 248 disposed along sidewalls of the fin-shaped structures 212 may remain to form sidewalls spacers 2480. At least a lower portions of each of the fin-shaped structures 212 is disposed between a sidewall spacer 2480 and the center dielectric fin 220 along the X direction. The sidewall spacers 2480 may function to control the epitaxial growth of source/drain features.

FIG. 10 illustrates a fragmentary cross-sectional view of the workpiece 200 along line A-A' in FIG. 9. Line A-A' cuts through one of the fin-shaped structures 212. As shown in FIG. 9, the dummy gate stack 240 extends lengthwise along the X direction and is disposed over a channel region 212C of the fin-shaped structure 212. The channel region 212C is sandwiched between two source/drain regions 212SD of the fin-shaped structure 212. The source/drain trenches 250 are disposed directly over the source/drain regions 212SD and expose sidewalls of the channel layers 208 and the sacrificial layers 206. In some implementations illustrated in FIGS. 9 and 10, the source/drain trenches 250 at least partially extend into the base portion 212B to form rounded bottom surfaces.

Figure 11:
Figure 11:
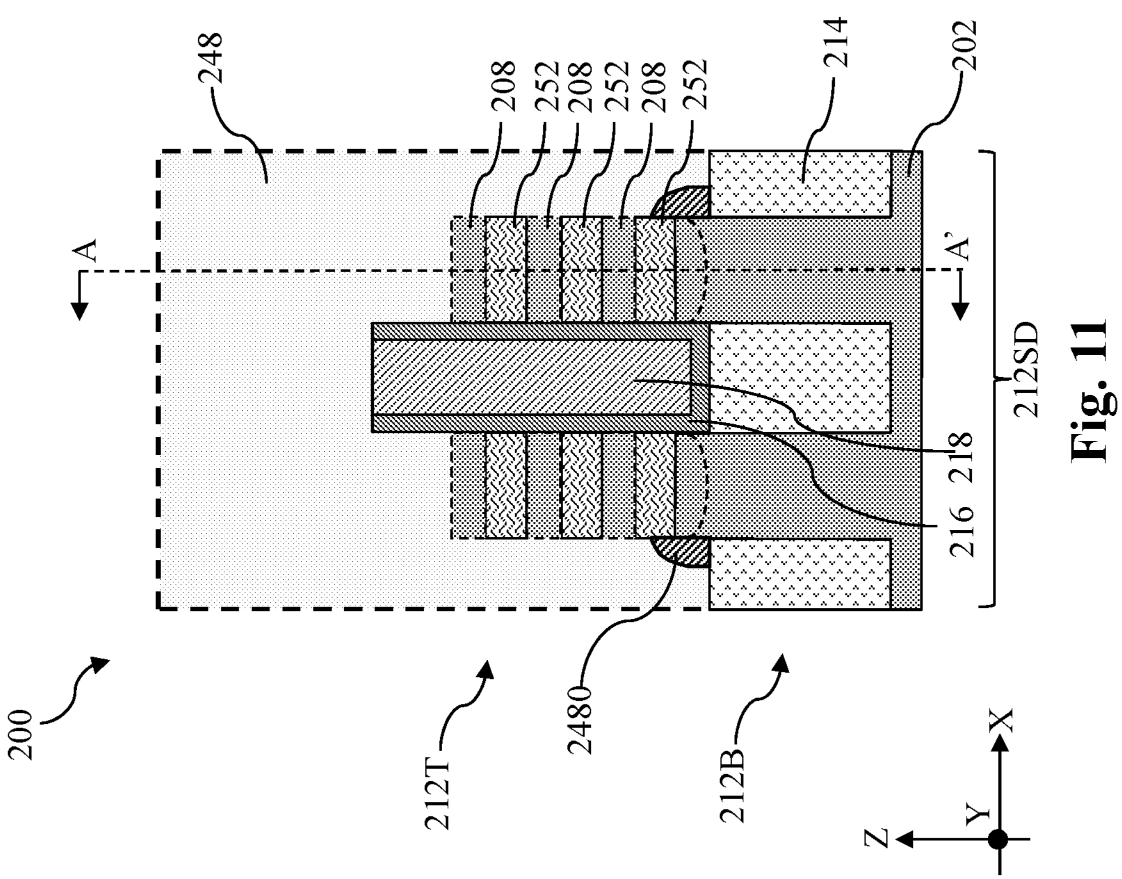

Referring to FIGS. 1 and 11, method 100 includes a block 116 where inner spacer features 252 are formed. Referring to FIG. 11, at block 116, the sacrificial layers 206 exposed in the source/drain trenches 250 are first selectively and partially recessed to form inner spacer recesses, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone. In some other embodiments, the selective recess may include a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 252, as illustrated in FIG. 11.

Figure 12:
Figure 12:
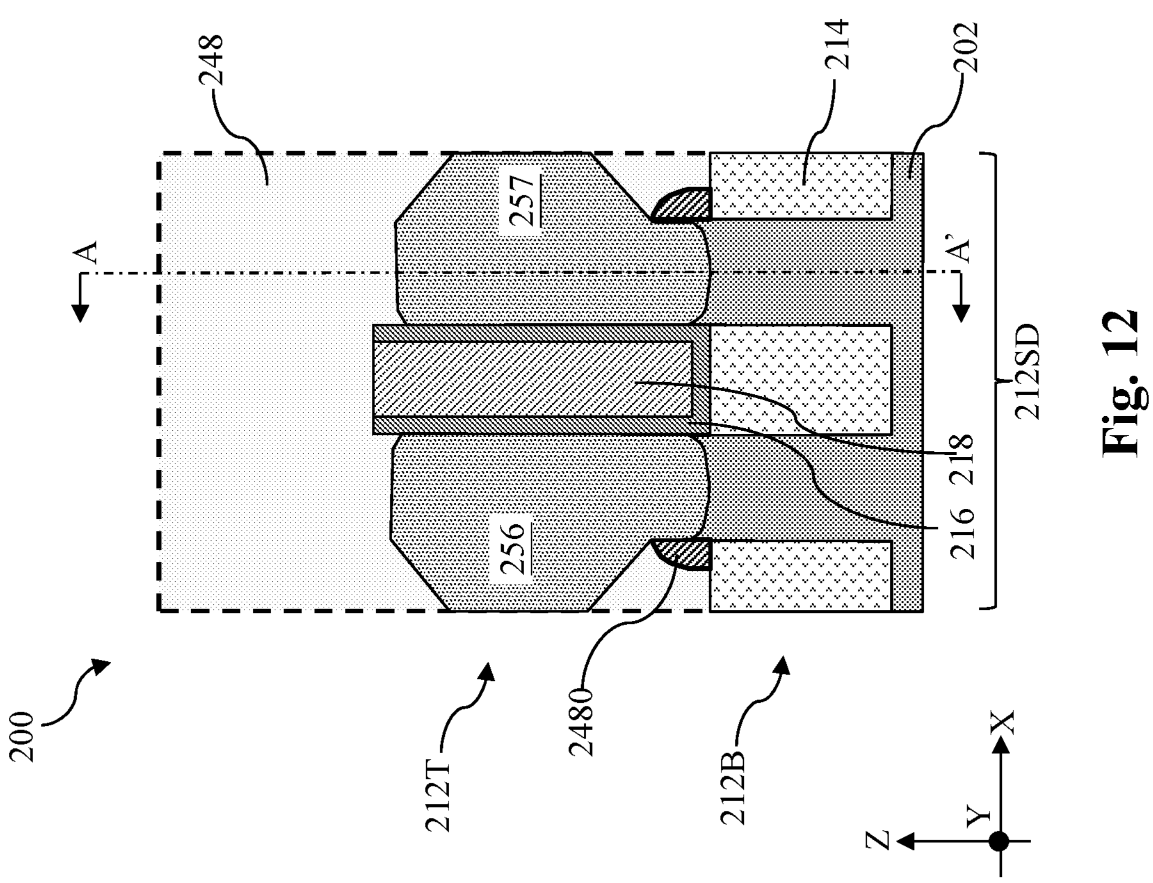
Figure 13:
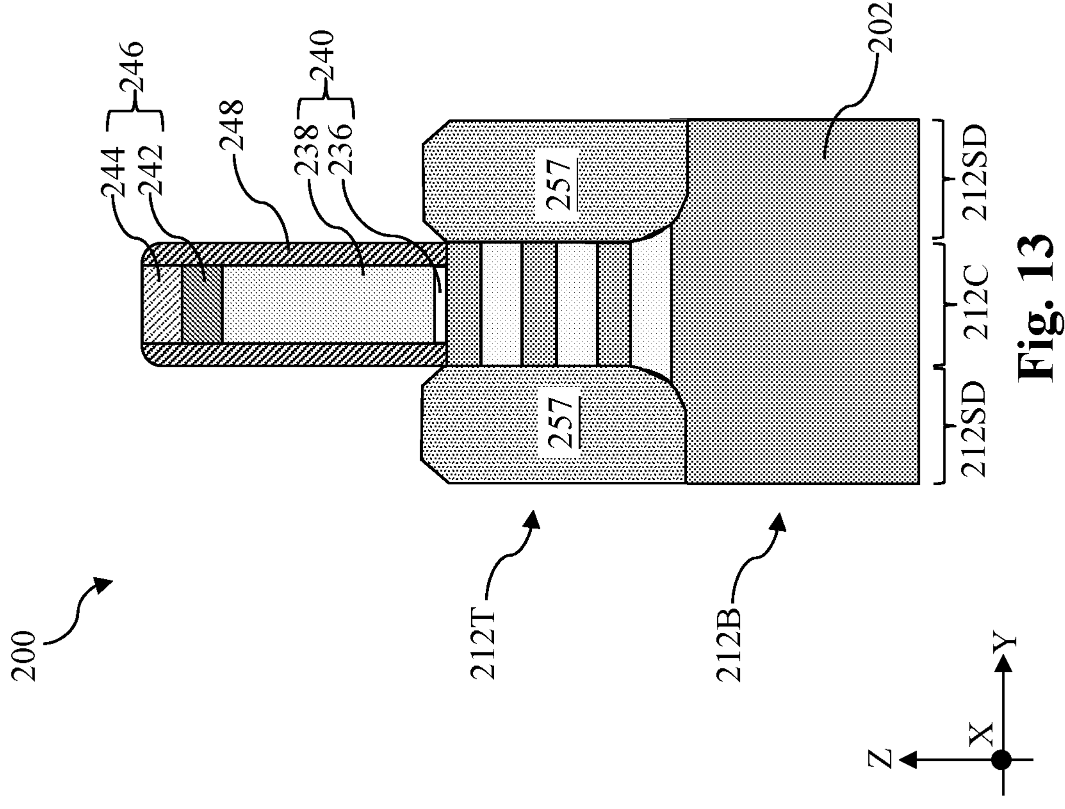
Figure 14:
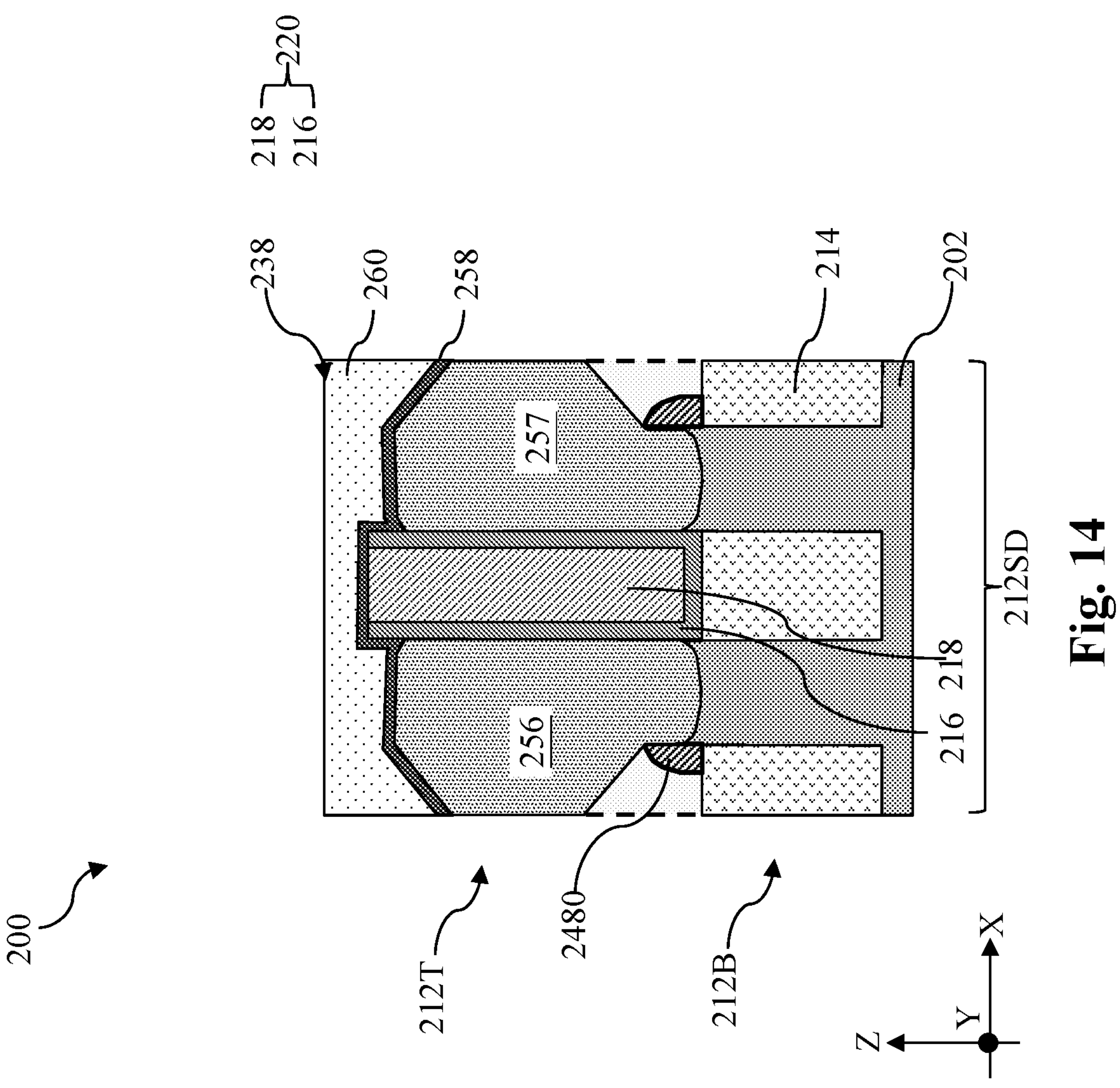

Referring to FIGS. 1, 12 and 13, method 100 includes a block 118 where a first source/drain feature 256 and a second source/drain feature 257 are formed. The first source/drain feature 256 and the second source/drain feature 257 are selectively and epitaxially deposited on the exposed semiconductor surfaces of the channel layers 208 and the substrate 202 in the source/drain trenches 250. The first source/drain feature 256 and the second source/drain feature 257 may be deposited using an epitaxial process, such as vapor-phase epitaxy (VPE), ultra-high vacuum CVD (UHV-CVD), molecular beam epitaxy (MBE), and/or other suitable processes. Depending on the design of the semiconductor device 200, the first source/drain feature 256 and the second source/drain feature 257 in contact with the center dielectric fin 220 may have different conductivity types. In some embodiments where a complementary metal oxide semiconductor field effect transistor (CMOSFET) is desired, one of the first source/drain feature 256 and the second source/drain feature 257 is n-type and may include silicon (Si) doped with an n-type dopant, such as phosphorus (P) or arsenic (As) and the other is p-type and may include silicon germanium (SiGe) doped with a p-type dopant, such as boron (B) or gallium (Ga). Doping of the first source/drain feature 256 and the second source/drain feature 257 may be performed either in situ with their deposition or ex situ using an implantation process, such as a junction implant process. In one embodiment, the first source/drain feature 256 is p-type and the second source/drain feature 257 is n-type. In another embodiments, both the first source/drain feature 256 and the second source/drain feature 257 are n-type. In some other embodiments where a n-type MOSFET (NMOSFET) is desired, both the first source/drain feature 256 and the second source/drain feature 257 are n-type. In still other embodiments where p-type MOSFET (PMOSFET) is desired, both the first source/drain feature 256 and the second source/drain feature 257 are p-type.

In some embodiments represented in FIG. 12, the first source/drain feature 256 and the second source/drain feature 257 deposited epitaxially include faceted structure. Because the center dielectric fin 220 defines boundaries of the first source/drain feature 256 and the second source/drain feature 257, the first source/drain feature 256 and the second source/drain feature 257 may only epitaxially grow outward from the sidewalls of the center dielectric fin 220. At the same time, the sidewall spacers 2480 limit the sideway growth of lower portions of the first source/drain feature 256 and the second source/drain feature 257. As a result, an upper portion of the first source/drain feature 256 may extend outward from the center dielectric fin 220 to overhang the sidewall spacer 2480 adjacent the first source/drain feature 256. Similarly, an upper portion of the second source/drain feature 257 may extend outward from the center dielectric fin 220 to overhang the sidewall spacer 2480 adjacent the second source/drain feature 257. FIG. 13 illustrates a fragmentary cross-sectional view of the workpiece 200 along line A-A' in FIG. 12. Along the Y direction, two second source/drain features 257 sandwich the sacrificial layers 206 and the channel layers 208 in the channel region 212C Referring still to FIGS. 1 and 14, method 100 includes a block 120 where a contact etch stop layer (CESL) 258 and an interlayer dielectric (ILD) layer 260 are deposited. In some embodiments, the CESL 258 is first conformally deposited over the workpiece 200 and then the ILD layer 260 is blanketly deposited over the CESL 258. The CESL 258 may include silicon nitride, silicon oxynitride, and/or other materials known in the art. The CESL 258 may be deposited using ALD, plasma-enhanced chemical vapor deposition (PECVD) process and/or other suitable deposition or oxidation processes. In some embodiments, the ILD layer 260 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 260 may be deposited by spin-on coating, an FCVD process, or other suitable deposition technique. In some embodiments, after formation of the ILD layer 260, the workpiece 200 may be annealed to improve integrity of the ILD layer 260. To remove excess materials and to expose top surfaces of the dummy electrode 238 of the dummy gate stacks 240, a planarization process (such a chemical mechanical polishing (CMP) process) may be performed to the workpiece 200 to provide a planar top surface. Top surfaces of the dummy electrodes 238 over the channel region 212C (out of plane) are exposed on the planar top surface.

Figure 15:
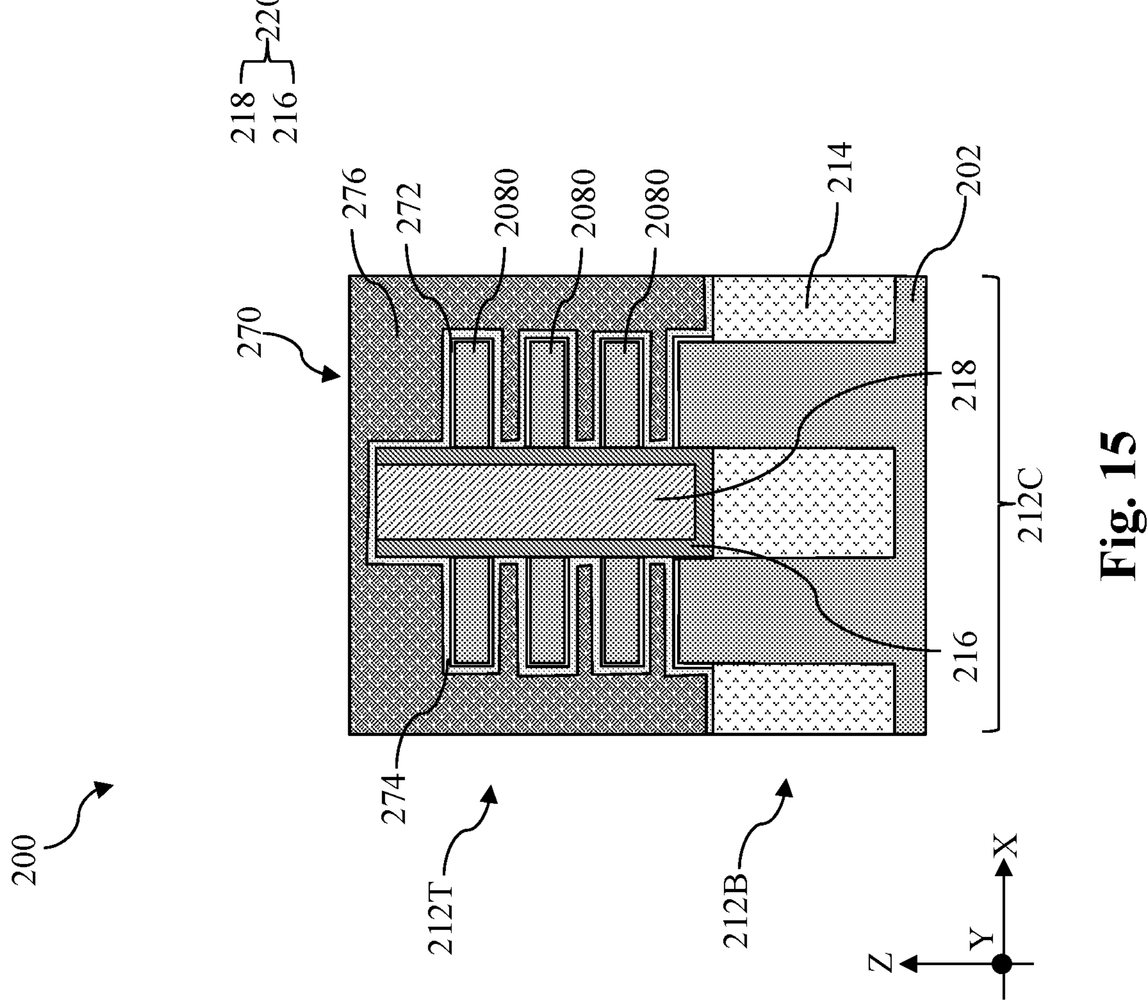

Referring to FIGS. 1 and 15, method 100 includes a block 122 where the channel layers 208 in the channel regions are released as channel members 2080. At block 122, the dummy gate stack 240 exposed at the conclusion of block 120 is removed from the workpiece 200 by a selective etch process. The selective etch process may be a selective wet etch process, a selective dry etch process, or a combination thereof. In the depicted embodiments, the selective etch process selectively removes the dummy dielectric layer 236 and the dummy electrode 238 without substantially the at least one gate spacer 248. After the removal of the dummy gate stack 240, channel layers 208 and sacrificial layers 206, in the channel region are exposed. The exposed sacrificial layers 206 may be selectively removed to release the channel layers 208 as channel members 2080. As shown in FIG. 15, when viewed along the Y direction, the channel members 2080 have appearances of cantilever beams stemming from the center dielectric fin 220. In the depicted embodiments where the channel members 2080 resemble a sheet or a nanosheet, the channel member release process may also be referred to as a sheet formation process. After their release, the channel members 2080 are in contact with the center dielectric fin 220. The channel members 2080 are vertically stacked along the Z direction. The selective removal of the sacrificial layers 206 may be implemented by selective dry etch, selective wet etch, or other selective etch processes. In some embodiments, the selective wet etching includes ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$.

Referring to FIGS. 1 and 15, method 100 includes a block 124 where a gate structure 270 is formed to wrap around each of the channel members 2080. The gate structure 270 may include an interfacial layer 272 on surfaces of the channel members 2080 and the base portions 212B, a gate dielectric layer 274 over the interfacial layer 272, and a gate electrode layer 276 over the gate dielectric layer 274. In some embodiments, the interfacial layer 272 includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and base portions 212B to form the interfacial layer 272. The gate dielectric layer 274 is then deposited over the interfacial layer 272, exposed surfaces of the center dielectric fin 220, exposed surfaces of the isolation feature 214 using ALD, CVD, and/or other suitable methods. The gate dielectric layer 274 may include high-k dielectric materials. In one embodiment, the gate dielectric layer 274 may include hafnium oxide. Alternatively, the gate dielectric layer 274 may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material.

After the formation or deposition of the interfacial layer 272 and the gate dielectric layer 274, the gate electrode layer 276 is deposited over the gate dielectric layer 274. The gate electrode layer 276 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 276 may be formed by ALD, PVD, CVD, e-beam evaporation, or other suitable process. Although not explicitly shown in the figures, subsequent processes may include formation of a gate cut feature to divide the gate structure 270 into a first gate structure over the stack of channel members 2080 on the left-hand side of the center dielectric fin 220 and a second gate structure over the stack of channel members 2080 on the right-hand side of the center dielectric fin 220. The first gate structure and the second gate structure are electrically insulated from one another. As shown in FIG. 15, the gate structure 270 wraps around each of the channel members 2080 and wraps over the center dielectric fin 220.

Figure 17:
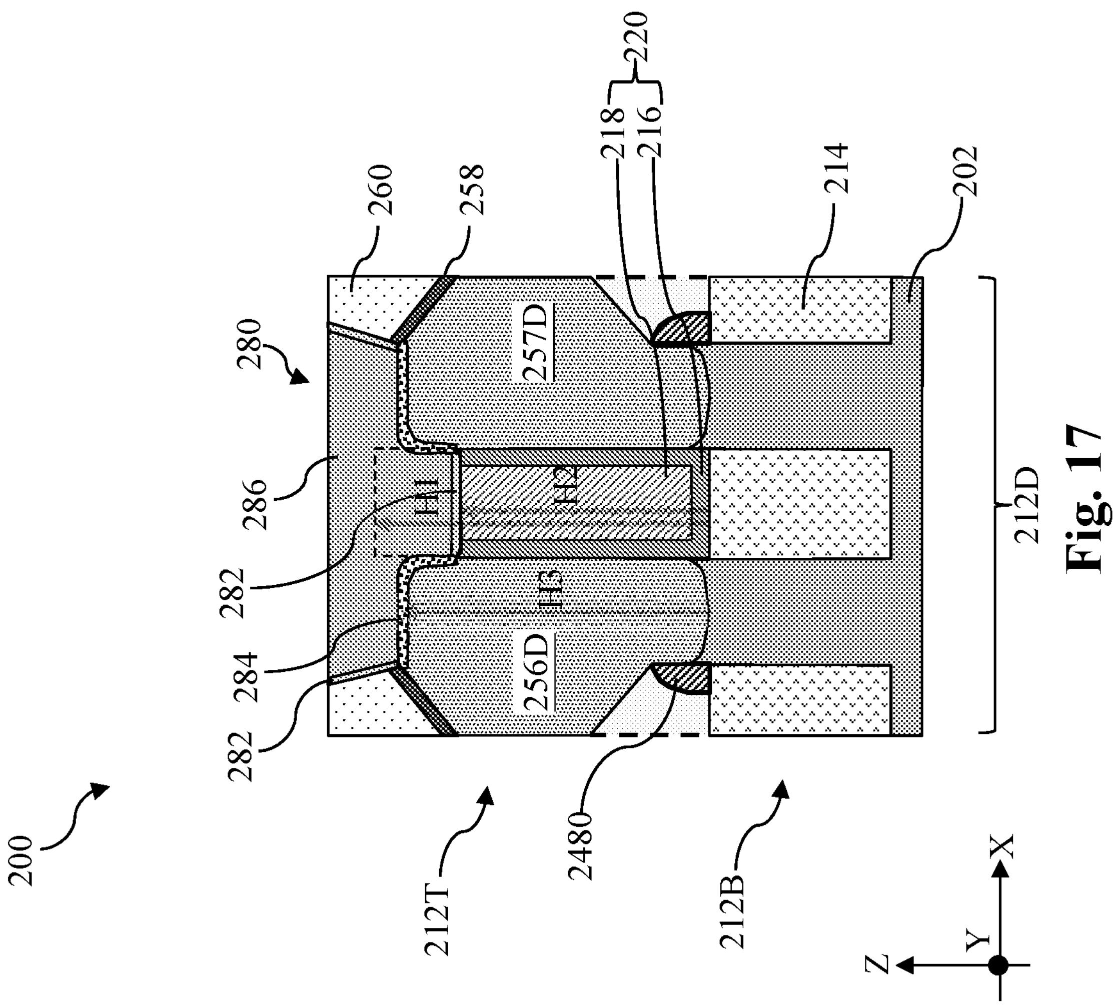
Figure 18:
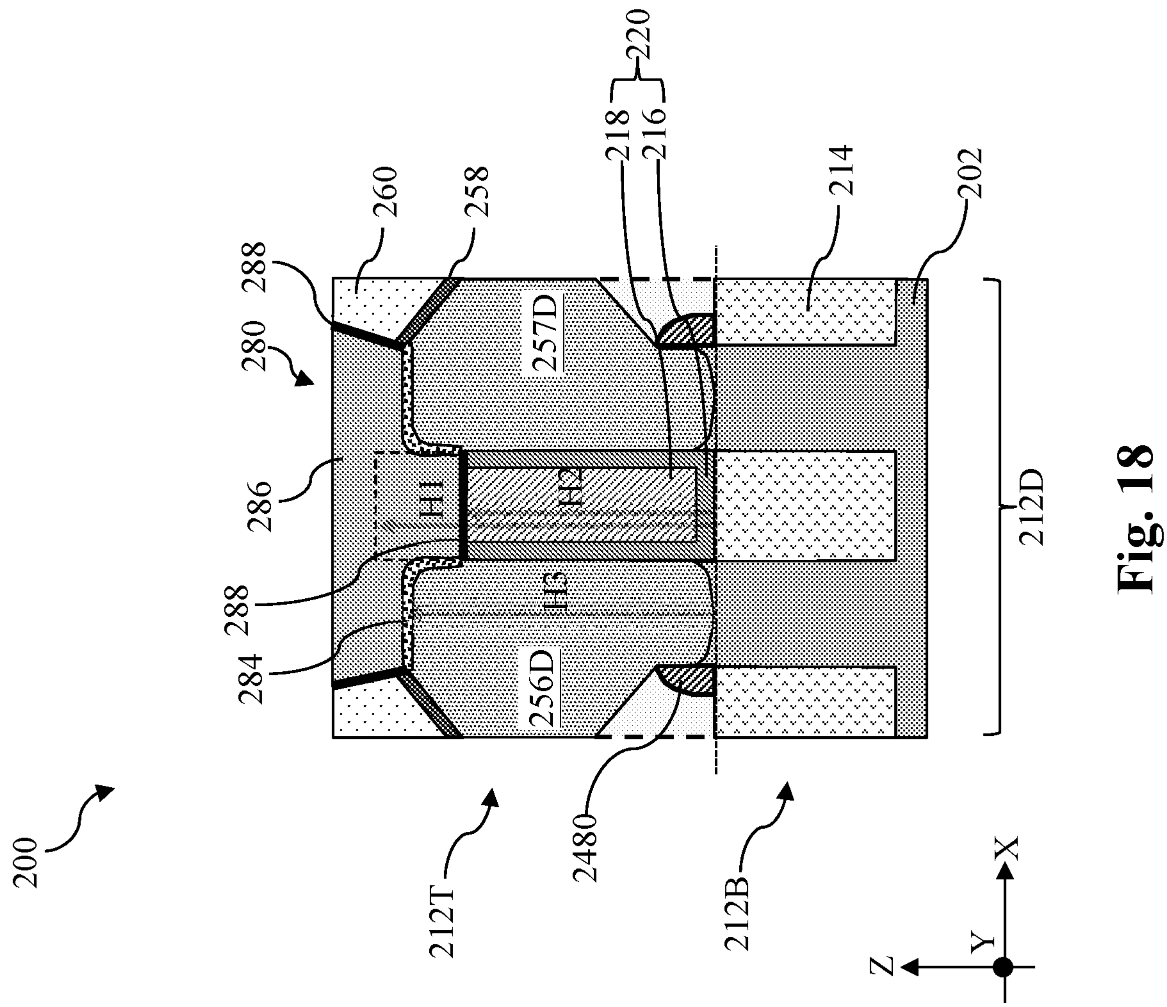
Figure 19:
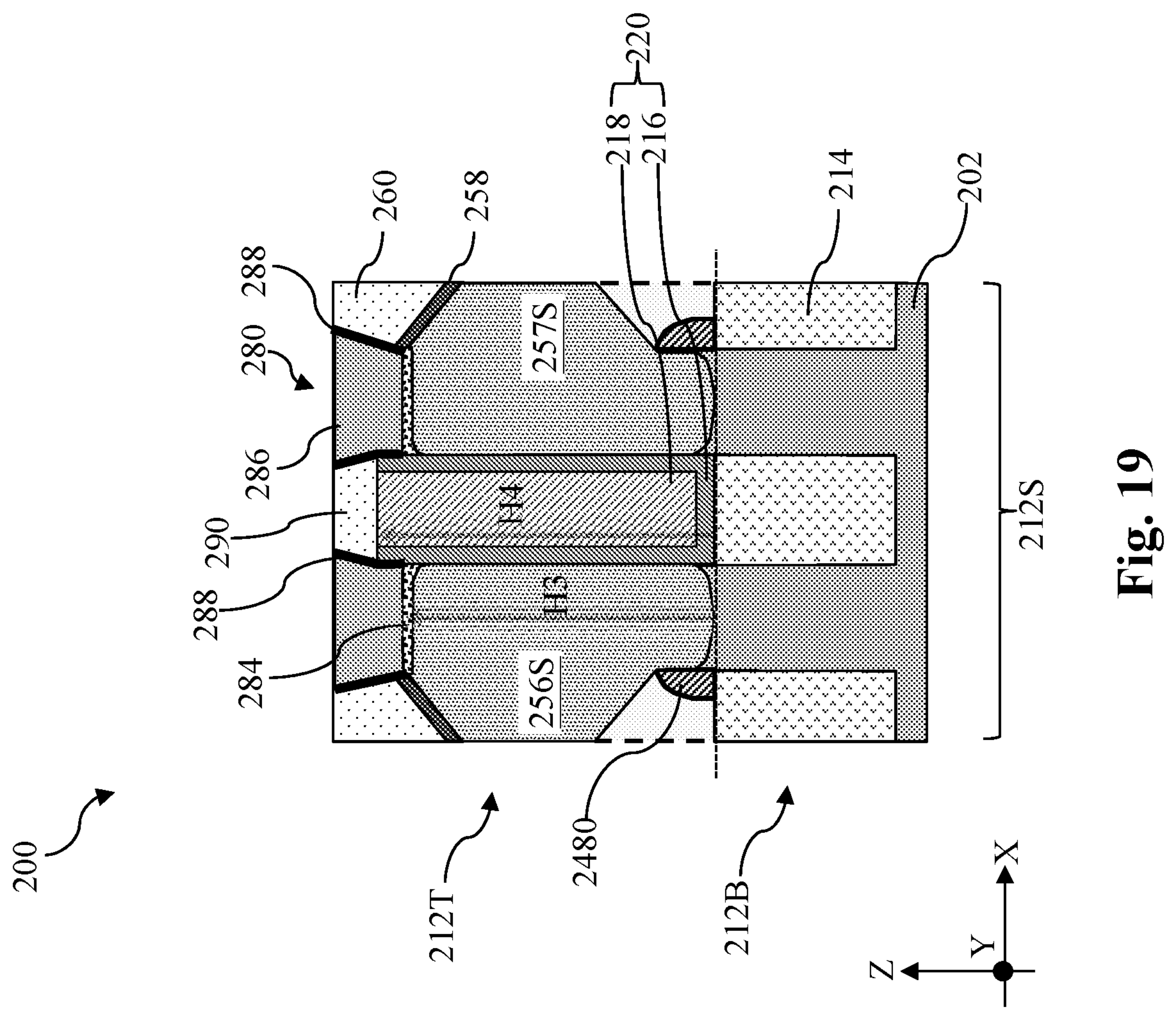
Figure 20:
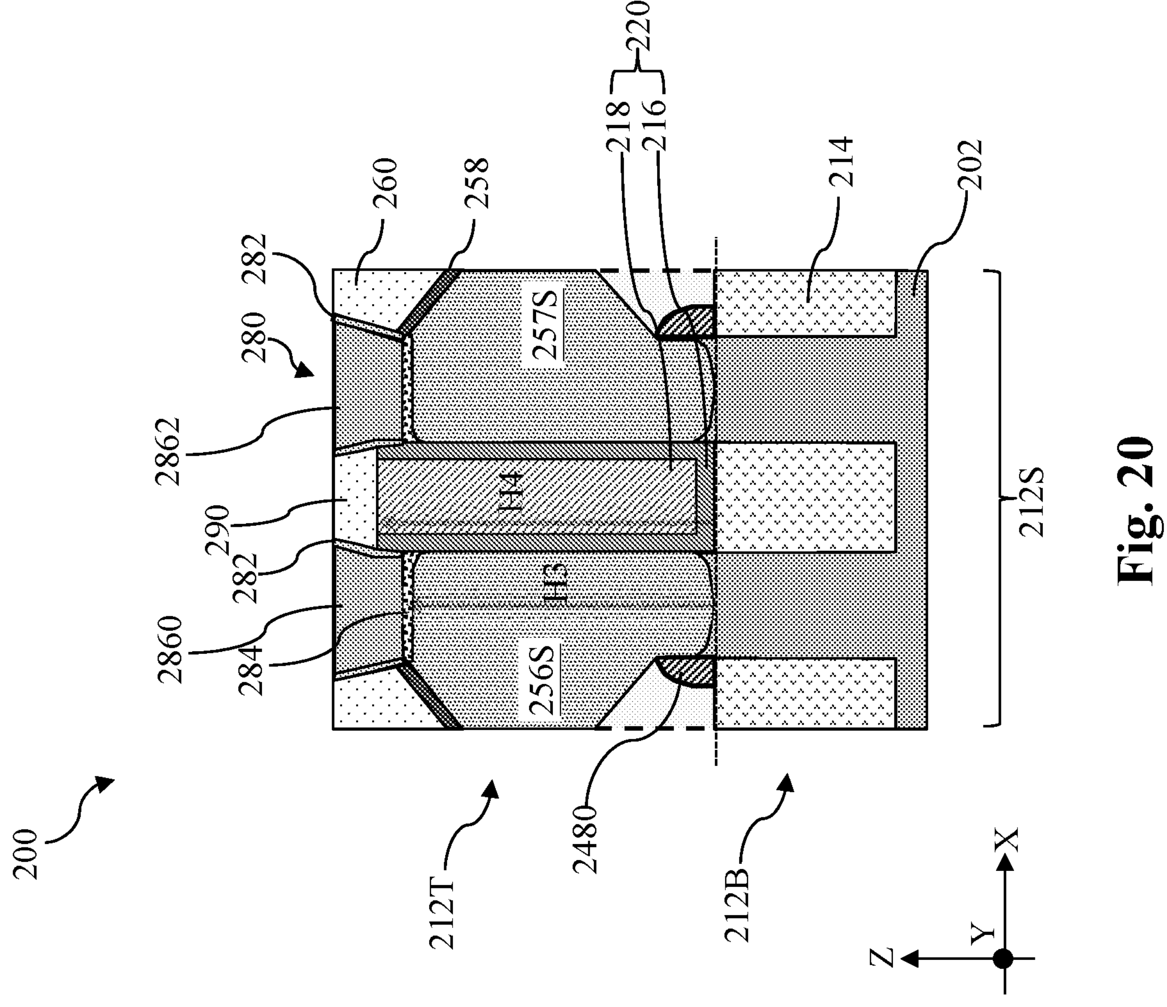

Referring to FIGS. 1 and 16, method 100 includes a block 126 where a common source/drain contact opening 278 is formed to expose the first source/drain feature 256, the second source/drain feature 257, and the center dielectric fin 220. In the depicted embodiments where a CMOSFET is desired, the n-type drain feature of the NMOSFET and the p-type drain feature of the PMOSFET are shorted together while the n-type source feature of the NMOSFET and the p-type source feature of the PMOSFET are electrically isolated from one another. FIGS. 16-18 depict the drain region 212D of the source/drain region 212SD that includes a first drain feature 256D and a second drain feature 257D. FIGS. 19-20 depict the source region 212S of the source/drain region 212SD that includes a first source feature 256S and a second source feature 257S. In an example process, a patterned etch mask is formed over the workpiece 200 to expose the first drain feature 256D, the second drain feature 257D and the center dielectric fin 220. After the formation of the patterned hard mask, drain regions 212D are etched using the patterned hard mask as an etch mask to form the common source/drain contact opening 278. According to the present disclosure, the formation of the common source/drain contact opening 278 may include at least two etch processes. In one embodiment, the at least two etch processes includes a less selective dry etch process to etch the first drain feature 256D, the second drain feature 257D, and the center dielectric fin 220 and a selective dry etch process to further recess the center dielectric fin 220. In another embodiment, the at least two etch processes includes a less selective dry etch process to etch the first drain feature 256D, the second drain feature 257D, and the center dielectric fin 220 and a selective wet etch process to further recess the center dielectric fin 220. Examples of the less selective dry etch process may include use of oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Examples of the selective dry etch process may include use of hydrogen ($H_2$), helium (He), a fluorine-containing gas (e.g., $CF_4$, $SF_6$, $CH_2F_2$, $CHF_3$, and/or $C_2F_6$), or a hydrocarbon gas (e.g., $CH_4$ or $C_2H_6$). Example of the selective wet etch process may include use of phosphoric acid ($H_3PO_4$). As described above, the center dielectric fin 220 may include a nitride-based dielectric material. The aforementioned example selective dry etch processes and example selective wet etch processes may be selective to nitride-based dielectric materials.

As a result of the implementation of the at least two etch processes at block 126, the common source/drain contact opening 278 may include a first depth D1 measured from a top surface of the first drain feature 256D or that of the second drain feature 257D and a second depth D2 measured from the recessed top surface of the center dielectric fin 220, as shown in FIG. 16. In some instances, the first depth D1 is between about 15 nm and about 35 nm and the second depth D2 is between about 30 nm and about 80 nm. As illustrated in FIG. 16, the common source/drain contact opening 278 exposes not only top surfaces of the first drain feature 256D and the second drain feature 257D but also a portion of the sidewalls of the first drain feature 256D and the second drain feature 257D. It is noted that, at block 126, only a portion of the center dielectric fin 220 in the drain regions 212D is recessed but another portion of the center dielectric fin 220 (shown in dotted line, in the channel region 212C) underlying the gate structure 270 is not recessed. As a result, the center dielectric fin 220 may be considered to have a first portion under the gate structure 270 and a second portion between the first drain feature 256D and the second drain feature 257D. The first portion is not recessed at block 126 and has a height greater than the second portion. As shown in FIG. 16, the common source/drain contact opening 278 exposes a sidewall of the first portion of the center dielectric fin 220.

Referring to FIGS. 1, 17 and 18, method 100 includes a block 128 where a common source/drain contact 280 is formed to electrically couple to the first drain feature 256D and the second drain feature 257D. In one embodiment represented in FIG. 17, the common source/drain contact 280 includes a conductive layer 282 in contact with the center dielectric fin 220, the CESL 258 and the ILD layer 260 and a silicide layer 284 in contact with the first drain feature 256D and the second drain feature 257D. In another embodiment represented in FIG. 18, the common source/drain contact 280 includes a barrier layer 288 in contact with the center dielectric fin 220, the CESL 258 and the ILD layer 260 and a silicide layer 284 in contact with the first drain feature 256D and the second drain feature 257D.

To form the common source/drain contact 280 shown in FIG. 17, a conductive layer 282 is first deposited over the workpiece 200, including over the common source/drain contact opening 278 by PVD or a suitable deposition method. In some instances, the conductive layer 282 may be referred to a metal precursor layer and may include titanium (Ti), cobalt (Co), or nickel (Ni), or a suitable metal. After the deposition of the conductive layer 282, an anneal process is performed to the workpiece 200 to bring about silicidation reaction between the conductive layer 282 and the source/drain features (including the first drain feature 256D and the second drain feature 257D) to form the silicide layer 284. As shown in FIG. 17, the silicide layer 284 wraps around a corner of the first drain feature 256D and wraps around a corner of the second drain feature 257D. That is, the silicide layer 284 is in contact with top surfaces and sidewalls of the first drain feature 256D and the second drain feature 257D. After the anneal process, a metal fill layer 286 is deposited over the silicide layer 284 and the conductive layer 282. The metal fill layer 286 may include tungsten (W), cobalt (Co), copper (Cu), or ruthenium (Ru) and is in contact with the silicide layer 284 and the conductive layer 282. As measured from a top surface of the base portion 212B, the center dielectric fin 220 (shown in dotted lines as it is out of plane)

below the gate structure 270 has a first height (H1), the first drain feature 256D or the second drain feature 257D has a second height (H2), and the center dielectric fin 220 below the common source/drain contact 280 has a third height (H3). In the depicted embodiments, the first height H1 is greater than the third height H3 and the third height H3 is greater than the second height H2. In some embodiments not explicitly shown in FIG. 17, the conductive layer 282 that is not transformed into the silicide layer 284 may be selectively removed before the deposition of the metal fill layer 286. In the embodiment represented in FIG. 17, the metal fill layer 286 is spaced apart from the gate structure 270 and the center dielectric fin 220 under the gate structure 270 by the conductive layer 282.

To form the common source/drain contact 280 shown in FIG. 18, a conductive layer 282 is first deposited over the workpiece 200, including over the common source/drain contact opening 278 by PVD or a suitable deposition method. In some instances, the conductive layer 282 may be referred to a metal precursor layer and may include titanium (Ti), cobalt (Co), or nickel (Ni), or a suitable metal. After the deposition of the conductive layer 282, an anneal process is performed to the workpiece 200 to bring about silicidation reaction between the conductive layer 282 and the source/drain features (including the first drain feature 256D and the second drain feature 257D) to form the silicide layer 284. After the anneal process, a nitridation process is performed to transform the conductive layer 282 or a portion thereof into a barrier layer 288. The barrier layer 288 may include titanium nitride, cobalt nitride or nickel nitride. A metal fill layer 286 is then deposited over the silicide layer 284 and the conductive layer 282. The metal fill layer 286 may include tungsten (W), cobalt (Co), copper (Cu), or ruthenium (Ru) and is in contact with the silicide layer 284 and the barrier layer 288. The barrier layer 288 spaces the metal fill layer 286 apart from the center dielectric fin 220 and the ILD layer 260 to prevent oxygen diffusion into the metal fill layer 286. As measured from a top surface of the base portion 212B, the center dielectric fin 220 (shown in dotted lines as it is out of plane) below the gate structure 270 has a first height (H1), the first drain feature 256D or the second drain feature 257D has a second height (H2), and the center dielectric fin 220 below the common source/drain contact 280 has a third height (H3). In the depicted embodiments, the first height H1 is greater than the third height H3 and the third height H3 is greater than the second height H2. In the embodiment represented in FIG. 18, the metal fill layer 286 is spaced apart from the gate structure 270 and the center dielectric fin 220 under the gate structure 270 by the barrier layer 288.

Reference is now made to FIGS. 19 and 20, each of which illustrate a cross-sectional view of a source region 212S of a CMOSFET that includes an NMOSFET and a PMOSFET. As shown in FIGS. 19 and 20, the center dielectric fin 220 in the source region 212S is not recessed as shown in FIG. 16. As a result, the center dielectric fin 220 in the source region 212S has fourth height H4. While the fourth height H4 is smaller than first height H1 due to lack of intentional recessing of the center dielectric fin 220, the fourth height H4 is greater than the third height H3 of the first source feature 256S and the second source feature 257S to electrically isolate them from one another. In some embodiments illustrated in FIGS. 19 and 20, a first source contact 2860 is disposed over and electrically coupled to the first source feature 256S and a second source contact 2862 is disposed over and electrically coupled to the second source feature 257S. In the depicted embodiments, the first source contact 2860 and the second source contact 2862 are electrically isolated from one another by a cut contact feature 290. The cut contact feature 290 may include silicon oxide, silicon nitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments illustrated in FIG. 19, each of the first source contact 2860 and the second source contact 2862 is spaced apart from the CESL 258, the ILD layer 260, the first layer 216, and the cut contact feature 290 by the conductive layer 282. In some embodiments illustrated in FIG. 20, each of the first source contact 2860 and the second source contact 2862 is spaced apart from the CESL 258, the ILD layer 260, the first layer 216, and the cut contact feature 290 by the barrier layer 288.

In one aspect, the present disclosure provides a semiconductor structure. The semiconductor structure includes a first base portion and a second base portion extending lengthwise along a first direction, a first source/drain feature disposed over the first base portion, a second source/drain feature disposed over the second base portion, a center dielectric fin sandwiched between the first source/drain feature and the second source/drain feature along a second direction perpendicular to the first direction, and a source/drain contact disposed over the first source/drain feature, the second source/drain feature and the center dielectric fin. A portion of the source/drain contact extends between the first source/drain feature and the second source/drain feature along the second direction.

In some embodiments, a top surface and a sidewall of the first source/drain feature are spaced apart from the source/drain contact by a silicide layer. In some embodiments, the semiconductor structure further includes a first sidewall spacer disposed along a sidewall of the first source/drain feature such that a lower portion of the first source/drain feature is disposed between the first sidewall spacer and the center dielectric fin along the second direction and a second sidewall spacer disposed along a sidewall of the second source/drain feature such that a lower portion of the second source/drain feature is disposed between the second sidewall spacer and the center dielectric fin along the second direction. In some implementations, top surfaces of the first sidewall spacer and the second sidewall spacer are lower than a top surface of the center dielectric fin under the source/drain contact. In some instances, an upper portion of the first source/drain feature overhangs the first sidewall spacer and an upper portion of the second source/drain feature overhangs the second sidewall spacer. In some embodiments, the first source/drain feature includes silicon and an n-type dopant and the second source/drain feature includes silicon germanium and a p-type dopant. In some instances, the center dielectric fin includes a liner in contact with the first source/drain feature and the second source/drain feature and a filler spaced apart from the first source/drain feature and the second source/drain feature. In some embodiments, the liner and the filler includes a nitride-based dielectric material. In some instances, the source/drain contact includes tungsten, cobalt, copper, or a combination thereof.

In another aspect, the present disclosure provides a semiconductor structure. The semiconductor structure includes a first mesa and a second mesa extending lengthwise along a first direction, the first mesa including a first channel region and a first source/drain region, the second mesa including a second channel region and a second source/drain region, a first stack of nanostructures disposed over the first channel region, a second stack of nanostructures disposed over the second channel region, a first source/drain feature in contact with the first stack of nanostructures and disposed over the first source/drain region, a second source/drain feature in contact with the second stack of nanostructures and disposed over the second source/drain region, a center dielectric fin including a first portion between the first channel region and the second channel region and a second portion between the first source/drain feature and the second source/drain feature along a second direction perpendicular to the first direction, and a source/drain contact disposed over the first source/drain feature, the second source/drain feature, and the second portion of the center dielectric fin. A portion of the source/drain contact extends between the first source/drain feature and the second source/drain feature along the second direction.

In some embodiments, each of the first stack of nanostructures and each of the second stack of nanostructures are in contact with the first portion of the center dielectric fin. In some implementations, the semiconductor structure further includes a first gate structure wrapping around each of the first stack of nano structures, and a second gate structure wrapping around each of the second stack of nanostructures. In some instances, a top surface of the first portion is higher than a top surface of the second portion. In some embodiments, the semiconductor structure further includes a conductive layer sandwiched between the source/drain contact and a top surface of the second portion of the center dielectric fin. In some embodiments, the conductive layer includes titanium or titanium nitride.

In yet another aspect, the present disclosure provides a method. The method includes forming a stack over a substrate, the stack including a plurality of channel layers interleaved by a plurality of sacrificial layers, patterning the stack and a portion of the substrate to form a first fin-shaped structure and a second fin-shaped structure, forming a center dielectric fin between the first fin-shaped structure and the second fin-shaped structure, forming a dummy gate stack over a first channel region of the first fin-shaped structure, a second channel region of the second fin-shaped structure, and a first portion of the center dielectric fin, recessing source/drain regions of the first fin-shaped structure and the second fin-shaped structure to form a first recess over the first fin-shaped structure and a second recess over the second fin-shaped structure, forming a first source/drain feature over the first recess, forming a second source/drain feature over the second recess, selectively removing the plurality of sacrificial layers in the first channel region and the second channel region to form first nanostructures in the first channel region and second nanostructures in the second channel region, forming a first gate structure to wrap around each of the first nanostructures and a second gate structure to wrap around each of the second nanostructure, and forming a source/drain contact over the first source/drain feature, the second source/drain feature, and the center dielectric fin. A portion of the source/drain contact extends between the first source/drain feature and the second source/drain feature.

In some embodiments, the method further includes before the forming of the dummy gate stack, selectively removing topmost sacrificial layers of the first fin-shaped structure and the second fin-shaped structure. In some implementations, the first source/drain feature includes silicon and an n-type dopant and the second source/drain feature includes silicon germanium and a p-type dopant. In some instances, the forming of the center dielectric fin includes conformally depositing a liner layer over the first fin-shaped structure and the second fin-shaped structure, depositing a filler layer over the liner layer, and planarizing the deposited filler layer to expose the liner layer. In some embodiments, a sidewall of the source/drain contact is in contact with the first portion of the center dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a first base portion and a second base portion extending lengthwise along a first direction;

an isolation feature disposed between the first base portion and the second base portion along a second direction different from the first direction, a first source/drain feature disposed over the first base portion;

a second source/drain feature disposed over the second base portion;

a dielectric structure disposed on a top surface of the isolation feature and sandwiched between the first source/drain feature and the second source/drain feature along the second direction; and a source/drain contact disposed over the first source/drain feature, the second source/drain feature and the dielectric structure, wherein top surfaces of the first base portion and the second base portion are higher than the top surface of the isolation feature, wherein a portion of the source/drain contact extends between the first source/drain feature and the second source/drain feature along the second direction, wherein the dielectric structure interfaces a sidewall of the first base portion and a sidewall of the second base portion.

2. The semiconductor structure of claim 1, wherein a top surface and a sidewall of the first source/drain feature are spaced apart from the source/drain contact by a silicide layer.

3. The semiconductor structure of claim 1, further comprising:

a first sidewall spacer disposed along a sidewall of the first source/drain feature such that a lower portion of the first source/drain feature is disposed between the first sidewall spacer and the dielectric structure along the second direction; and a second sidewall spacer disposed along a sidewall of the second source/drain feature such that a lower portion of the second source/drain feature is disposed between the second sidewall spacer and the dielectric structure along the second direction.

4. The semiconductor structure of claim 3, wherein top surfaces of the first sidewall spacer and the second sidewall spacer are lower than a top surface of the dielectric structure under the source/drain contact.

5. The semiconductor structure of claim 3, wherein an upper portion of the first source/drain feature overhangs the first sidewall spacer, wherein an upper portion of the second source/drain feature overhangs the second sidewall spacer.

6. The semiconductor structure of claim 1,
wherein the first source/drain feature comprises silicon and an n-type dopant,
wherein the second source/drain feature comprises silicon germanium and a p-type dopant.

7. The semiconductor structure of claim 1, wherein the dielectric structure comprises a liner in contact with the first source/drain feature and the second source/drain feature and a filler spaced apart from the first source/drain feature and the second source/drain feature.

8. The semiconductor structure of claim 7, wherein the liner and the filler comprise a nitride-based dielectric material.

9. The semiconductor structure of claim 1, wherein the source/drain contact comprises tungsten, cobalt, copper, ruthenium, or a combination thereof.

10. A semiconductor structure, comprising:
a first mesa and a second mesa extending lengthwise along a first direction, the first mesa comprising a first channel region and a first source/drain region, the second mesa comprising a second channel region and a second source/drain region;
a first stack of nanostructures disposed over the first channel region;
a second stack of nanostructures disposed over the second channel region;
a first source/drain feature in contact with the first stack of nanostructures and disposed over the first source/drain region;
a second source/drain feature in contact with the second stack of nanostructures and disposed over the second source/drain region;
a dielectric structure comprising a first portion between the first channel region and the second channel region and a second portion between the first source/drain feature and the second source/drain feature along a second direction perpendicular to the first direction; and
a source/drain contact disposed over the first source/drain feature, the second source/drain feature, and the second portion of the dielectric structure,
wherein a portion of the source/drain contact extends between the first source/drain feature and the second source/drain feature along the second direction,
wherein the source/drain contact interfaces the first source/drain feature and the second source/drain feature by way of a silicide layer,
wherein the source/drain contact interfaces a top surface of the dielectric structure by way of a conductive layer,
wherein a composition of the silicide layer is different from a composition of the conductive layer.

11. The semiconductor structure of claim 10, wherein each of the first stack of nanostructures and each of the second stack of nanostructures are in contact with the first portion of the dielectric structure.

12. The semiconductor structure of claim 10, further comprising:
a first gate structure wrapping around each of the first stack of nanostructures; and
a second gate structure wrapping around each of the second stack of nanostructures.

13. The semiconductor structure of claim 10, wherein a top surface of the first portion is higher than a top surface of the second portion.

14. The semiconductor structure of claim 10, further comprising:
a conductive layer sandwiched between the source/drain contact and a top surface of the second portion of the dielectric structure.

15. The semiconductor structure of claim 14, wherein the conductive layer comprises titanium, cobalt, nickel, titanium nitride, cobalt nitride, or nickel nitride.

16. A semiconductor structure, comprising:
a first base fin and a second base fin;
an isolation feature comprising a center portion disposed between the first base fin and the second base fin along a direction, a first portion disposed along a sidewall of the first base fin away from the second base fin, and a second portion disposed along a sidewall of the second base fin away from the first base fin;
a first source/drain feature disposed over the first base fin;
a second source/drain feature disposed over the second base fin;
a dielectric structure disposed over the center portion of the isolation feature and disposed between the first source/drain feature and the second source/drain feature along the direction;
a first sidewall spacer disposed on the first portion of the isolation feature to interface the first source/drain feature;
a second sidewall spacer disposed on the second portion of the isolation feature to interface the second source/drain feature; and
a source/drain contact disposed over the first source/drain feature, the second source/drain feature and the dielectric structure,
wherein a bottom surface of the source/drain contact interfaces top surfaces of the first source/drain feature and the second source/drain feature at a first level and interfaces a top surface of the dielectric structure at a second level lower than the first level.

17. The semiconductor structure of claim 16, further comprising:
first nanostructures stacked one over another over the first base fin;
second nanostructures stacked one over another over the second base fin; and
a gate structure disposed over the first nanostructures, the second nanostructures and the dielectric structure.

18. The semiconductor structure of claim 16, wherein the dielectric structure interfaces inner sidewalls of the first base fin and the second base fin.

19. The semiconductor structure of claim 17, wherein the gate structure interfaces outer sidewalls of the first base fin and the second base fin.

20. The semiconductor structure of claim 16,
wherein the dielectric structure comprises a liner in contact with the first source/drain feature and the second source/drain feature and a filler spaced apart from the first source/drain feature and the second source/drain feature,
wherein a composition of the liner is different from a composition of the filler.

* * * * *